US009340879B2

United States Patent
Yahata

(10) Patent No.: US 9,340,879 B2
(45) Date of Patent: May 17, 2016

(54) SUBSTRATE PROCESSING APPARATUS, METHOD FOR MANUFACTURING SEMICONDUCTOR DEVICE AND COMPUTER-READABLE RECORDING MEDIUM

(71) Applicant: HITACHI KOKUSAI ELECTRIC INC., Tokyo (JP)

(72) Inventor: Takashi Yahata, Oume (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 117 days.

(21) Appl. No.: 14/491,709

(22) Filed: Sep. 19, 2014

(65) Prior Publication Data

US 2015/0270119 A1     Sep. 24, 2015

(30) Foreign Application Priority Data

Mar. 18, 2014   (JP) ................................. 2014-055513

(51) Int. Cl.
*C23C 16/44* (2006.01)
*C23C 16/455* (2006.01)
(Continued)

(52) U.S. Cl.
CPC ............. *C23C 16/52* (2013.01); *C23C 16/4405* (2013.01); *C23C 16/4412* (2013.01); *C23C 16/45561* (2013.01); *C23C 16/45565* (2013.01);
(Continued)

(58) Field of Classification Search
CPC   C23C 16/34; C23C 16/4405; C23C 16/4412; C23C 16/45512; C23C 16/45523–16/45555; C23C 16/45529; C23C 16/45536; C23C 16/45561; C23C 16/45565; C23C 16/45574;
C23C 16/52; C23F 4/00; H01J 37/3244; H01J 37/32449; H01J 37/32834; H01J 37/32844; H01J 37/32862; H01J 21/67017; H01J 21/67098; Y02C 20/30; Y02P 70/605
See application file for complete search history.

(56) References Cited

U.S. PATENT DOCUMENTS

| 5,637,153 A | * | 6/1997 | Niino ...................... C23C 16/24 134/2 |
| 7,918,938 B2 | | 4/2011 | Provencher et al. |
| 8,925,562 B1 | * | 1/2015 | Toyoda ............... H01J 37/3244 134/182 |

(Continued)

FOREIGN PATENT DOCUMENTS

| JP | A-2005-109194 | 4/2005 |
| JP | 2011-501411 A | 1/2011 |

(Continued)

OTHER PUBLICATIONS

Feb. 3, 2015 Office Action issued in Japanese Application No. 2014-055513.

(Continued)

*Primary Examiner* — Jeffrie R Lund
*Assistant Examiner* — Stanislav Antolin
(74) *Attorney, Agent, or Firm* — Oliff PLC

(57) ABSTRACT

There is provided a substrate processing apparatus configured to process a substrate in a processing space by supplying a gas into the processing space through a shower head as a gas dispersion mechanism, including: a gas supply pipe connected to the shower head; a gas exhaust pipe connected to the shower head; and a cleaning gas supply system connected to the gas supply pipe and the gas exhaust pipe and configured to supply a cleaning gas into the shower head from both of the gas supply pipe and the gas exhaust pipe.

12 Claims, 7 Drawing Sheets

(51) Int. Cl.
  *C23C 16/52* (2006.01)
  *H01J 37/32* (2006.01)
(52) U.S. Cl.
  CPC ....... *H01J 37/3244* (2013.01); *H01J 37/32449* (2013.01); *H01J 37/32862* (2013.01)

(56) References Cited

U.S. PATENT DOCUMENTS

| | | | | |
|---|---|---|---|---|
| 8,986,450 | B1* | 3/2015 | Yanai | H01L 21/67017 118/715 |
| 9,028,648 | B1* | 5/2015 | Kamakura | C23C 16/4405 118/715 |
| 9,064,695 | B1* | 6/2015 | Hirochi | H01L 21/02186 |
| 9,163,309 | B2* | 10/2015 | Yamamoto | C23C 16/45542 |
| 2002/0073923 | A1* | 6/2002 | Saito | C23C 16/345 118/715 |
| 2004/0250775 | A1* | 12/2004 | Sakai | C23C 16/4405 118/728 |
| 2006/0093756 | A1* | 5/2006 | Rajagopalan | C23C 16/4404 427/569 |
| 2006/0266288 | A1* | 11/2006 | Choi | C23C 16/4405 118/715 |
| 2007/0087579 | A1* | 4/2007 | Kitayama | C23C 16/4405 438/778 |
| 2008/0041308 | A1* | 2/2008 | Hong | B08B 7/0035 118/723 R |
| 2008/0264337 | A1* | 10/2008 | Sano | C23C 16/4408 118/704 |
| 2009/0035947 | A1* | 2/2009 | Horii | C23C 16/18 438/765 |
| 2009/0090393 | A1 | 4/2009 | Outka et al. | |
| 2009/0130859 | A1* | 5/2009 | Itatani | C23C 16/0272 438/778 |
| 2009/0314309 | A1* | 12/2009 | Sankarakrishnan | B08B 5/00 134/1.1 |
| 2011/0008955 | A1* | 1/2011 | Horii | C23C 16/40 438/608 |
| 2011/0162580 | A1* | 7/2011 | Provencher | C23C 16/45536 118/715 |
| 2011/0230008 | A1* | 9/2011 | Lakshmanan | C23C 16/24 438/96 |
| 2013/0164943 | A1* | 6/2013 | Koshi | H01L 21/02057 438/758 |
| 2014/0272341 | A1* | 9/2014 | Duan | H01L 21/68757 428/212 |
| 2015/0187567 | A1* | 7/2015 | Ashihara | H01L 21/02104 438/758 |
| 2015/0221508 | A1* | 8/2015 | Kurita | H01L 21/02565 438/104 |
| 2015/0340226 | A1* | 11/2015 | Ashihara | H01L 21/02104 438/787 |

FOREIGN PATENT DOCUMENTS

| | | |
|---|---|---|
| JP | A-2011-228546 | 11/2011 |
| WO | 2005/024926 A1 | 3/2005 |

OTHER PUBLICATIONS

Dec. 14, 2015 Office Action issued in Taiwanese Patent Application No. 103122667.

* cited by examiner

SUBSTRATE PROCESSING APPARATUS, METHOD FOR MANUFACTURING SEMICONDUCTOR DEVICE AND COMPUTER-READABLE RECORDING MEDIUM

BACKGROUND

1. Technical Field

The present invention relates to a substrate processing apparatus, a method for manufacturing a semiconductor device and a non-transitory computer-readable recording medium.

2. Description of Related Art

Generally, a substrate processing apparatus used for applying processing such as film formation processing to a wafer, etc., is used in a manufacturing step of a semiconductor device. A single wafer processing-type apparatus for processing substrates one by one, is known as the substrate processing apparatus. The single wafer processing-type substrate processing apparatus includes an apparatus configured to apply processing to a substrate in a processing space by supplying a processing gas into the processing space through a shower head as a gas dispersion mechanism, so that the gas can be uniformly supplied to the substrate.

In such a substrate processing apparatus, cleaning processing utilizing a cleaning gas is performed, to remove an unnecessary film (byproduct, etc.) adhered to the shower head or the processing space, etc.

In such a single wafer processing-type substrate processing apparatus having the shower head as described above, preferably the processing gas (gas that contributes to film formation) is efficiently supplied into the processing space from the shower head. Meanwhile, in the cleaning processing, in order to completely remove a film adhered to the shower head, preferably the cleaning gas is efficiently supplied to not only the processing space, but also a desired spot of the shower head (for example, a part where a reaction product is easily formed).

Therefore, an object of the present invention is to provide a substrate processing apparatus, a method for manufacturing a semiconductor device and a non-transitory computer-readable recording medium, capable of improving a cleaning efficiency by efficiently supplying a cleaning gas to a desired spot in a shower head.

SUMMARY

According to a first aspect of the present invention, there is provided a substrate processing apparatus configured to process a substrate in a processing space by supplying a gas into the processing space through a shower head as a gas dispersion mechanism, including:

a gas supply pipe connected to the shower head;

a gas exhaust pipe connected to the shower head; and a cleaning gas supply system connected to the gas supply pipe and the gas exhaust pipe and configured to supply a cleaning gas into the shower head from both of the gas supply pipe and the gas exhaust pipe.

According to other aspect of the present invention, there is provided a method for manufacturing a semiconductor device, including:

processing a substrate in a processing space by supplying a gas into the processing space through a shower head as a gas dispersion mechanism; and supplying a cleaning gas into the shower head from both of a gas supply pipe connected to the shower head for supplying a gas into the shower head, and a gas exhaust pipe connected to the shower head for exhausting the gas from the shower head.

According to other aspect of the present invention, there is provided a non-transitory computer-readable recording medium storing a program used for executing:

a substrate processing procedure of processing a substrate in a processing space by supplying a gas into the processing space through a shower head as a gas dispersion mechanism;

a cleaning procedure of supplying a cleaning gas into the shower head from both sides of a gas supply pipe connected to the shower head for supplying a gas into the shower head, and a gas exhaust pipe connected to the shower head for exhausting the gas from the shower head.

According to the present invention, the cleaning gas can be efficiently supplied to a desired part of the shower head, and therefore cleaning efficiency can be improved.

FIRST EMBODIMENT OF THE PRESENT INVENTION

A first embodiment of the present invention will be described hereafter, with reference to the drawings.

(1) Structure of a Substrate Processing Apparatus

A substrate processing apparatus of this embodiment is configured as a single wafer processing-type substrate processing apparatus configured to apply processing to a substrate to be processed, one by one.

A semiconductor wafer substrate (simply called a "wafer" hereafter) with a semiconductor device built therein can be given as a substrate to be processed.

Etching, asking, and film formation processing, etc., can be given as the processing applied to the substrate. However, the processing of this embodiment is particularly the film formation processing.

Figure 1:
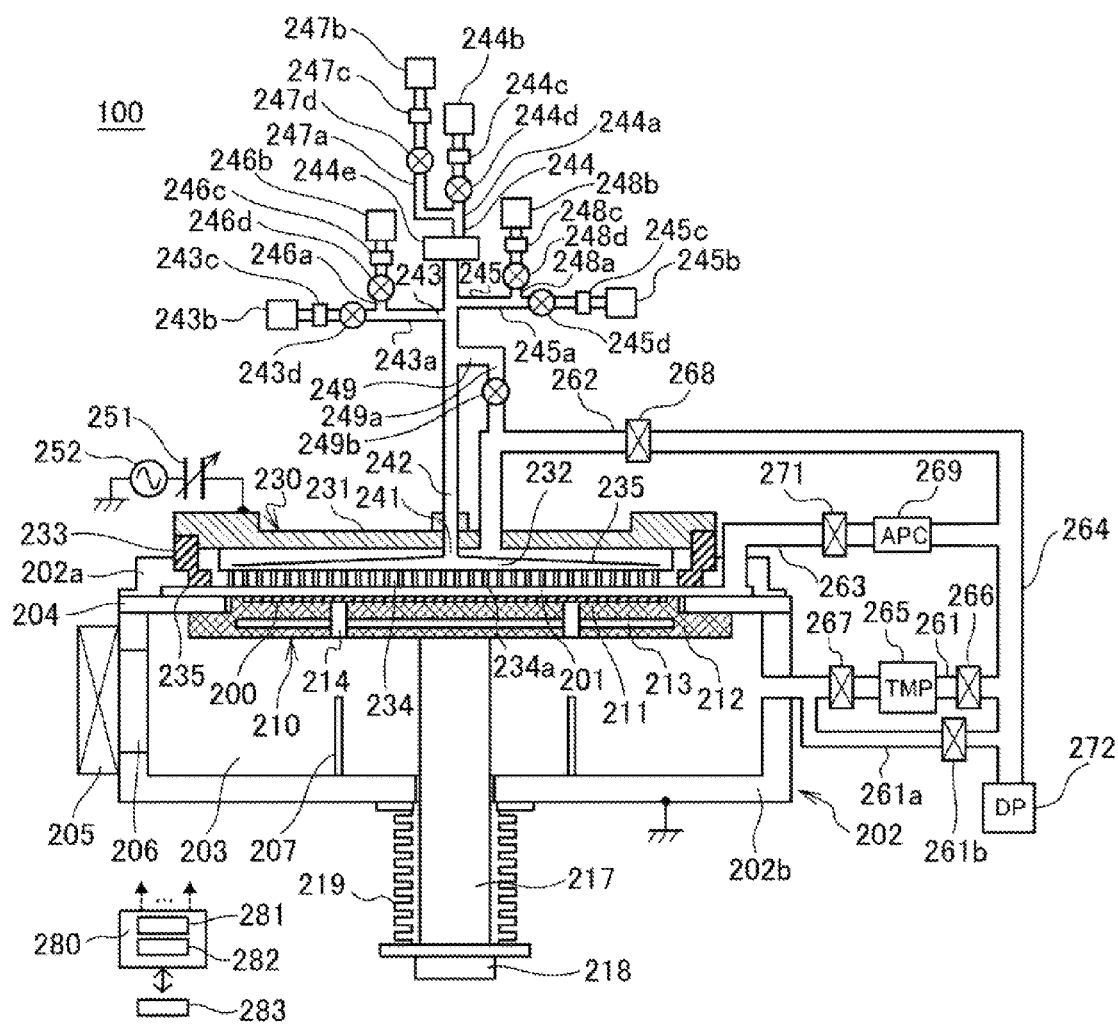
FIG. 1 is a schematic block diagram of a single wafer processing-type substrate processing apparatus according to an embodiment of the present invention.

The structure of the substrate processing apparatus of this embodiment will be described hereafter, with reference to FIG. 1. FIG. 1 is a schematic block diagram of the substrate processing apparatus according to this embodiment.

(Processing Vessel)

As shown in FIG. 1, a substrate processing apparatus 100 includes a processing vessel 202. The processing vessel 202 is configured as a flat sealed vessel with a cross-sectional face formed into a circular shape for example. Further, the processing vessel 202 is made of a metal material such as aluminum (Al) and stainless (SUS), etc. A processing space 201 for processing a wafer 200 and a transport space 203 for allowing the wafer 200 to pass through when the wafer 200 is transported into a processing space 201, are formed in the processing vessel 202. The processing vessel 202 is composed of an upper vessel 202a and a lower vessel 202b. A partition board 204 is provided between the upper vessel 202a and the lower vessel 202b.

A substrate loading outlet 206 adjacent to a gate valve 205 is provided on a side face of the lower vessel 202b, so that the wafer 200 can move between the substrate loading outlet 206 and a transfer chamber not shown. A plurality of lift pins 207 are provided on a bottom part of the lower vessel 202b. Further, the lower vessel 202b is grounded to earth.

A substrate supporting part 210 for supporting the wafer 200 is provided in a lower part of the processing space 201. The substrate supporting part 210 mainly includes a substrate mounting surface 211 for mounting the wafer 200 thereon, a substrate mounting table 212 having the substrate mounting surface 211 on a surface, and a heater 213 as a heating source included in the substrate mounting table 212. Through holes 214 through which lift pins 207 are passed, are provided on the substrate mounting table 212 at positions corresponding to the lift pins 207 respectively.

The substrate mounting table 212 is supported by a shaft 217. The shaft 217 is passed through the bottom part of the processing vessel 202, and is further connected to an elevation mechanism 218 outside of the processing vessel 202. The wafer 200 mounted on the substrate mounting surface 211 can be elevated by elevating the shaft 217 and the substrate mounting table 212 by operating the operation mechanism 211. A circumference of a lower end portion of the shaft 217 is covered with a bellows 219, thus air-tightly maintaining an inside of the processing vessel 202.

The substrate mounting table 212 is descended so that the substrate mounting surface 211 reaches a position (wafer transport position) which is opposed to the substrate loading outlet 206 when the wafer 200 is transported, and is elevated so that the wafer 200 reaches a processing position (wafer processing position) in the processing space 201 as shown in FIG. 1, when the wafer 200 is processed.

Specifically, when the substrate 212 is descended to the wafer transport position, an upper end portion of the lift pin 207 is protruded from an upper surface of the substrate mounting surface 211, so that the wafer 200 is supported by the lift pin 207 from a lower side. Further, when the substrate mounting table 212 is elevated to the wafer processing position, the lift pin 207 is embedded from the upper surface of the substrate mounting surface 211, so that the wafer 200 is supported by the substrate mounting surface 211 from the lower side. Since the lift pin 207 and the wafer 200 are brought into direct contact with each other, and therefore the lift pin 207 is preferably made of a material such as quartz and alumina.

(Shower Head)

A shower head 230 as a gas dispersion mechanism is provided in an upper part (upstream side in the gas supplying direction) of the processing space 201. A gas introducing hole 241 is provided on a lid 231 of the shower head 230, and a gas supply system described later is connected to the gas introducing hole 241. The gas introduced from the gas introducing hole 241 is supplied to a buffer space 232 of the shower head 230.

The lid 231 of the shower head 230 is made of a conductive metal, and is used as an electrode for generating plasma in the buffer space 232 or the processing space 201. An insulation block 233 is provided between the lid 231 and the upper vessel 202a, to thereby provide insulation between the lid 231 and the upper vessel 202a.

The shower head 230 includes a dispersion board 234 for dispersing a gas supplied from the supply system through the gas introducing hole 241. A buffer space 232 is formed on the upstream side of the dispersion board 234, and the processing space 201 is formed on the downstream side of the dispersion board 234. A plurality of through holes 234a are provided on the dispersion board 234. The dispersion board 234 is disposed to face the substrate mounting surface 211.

A gas guide 235 is provided in the buffer space 232, for forming a flow of a supplied gas. The gas guide 235 has a conical shape with a diameter spreading toward the dispersion board 234, having the gas introducing hole 241 as a vertex. The gas guide 235 is formed so that its lower end is positioned at further outer peripheral side of the through hole 234a which is formed at outermost peripheral side of the dispersion board 234.

(Plasma Generator)

A matching box 251 and a RF generator 252 are connected to the lid 231 of the shower head 230. Then, plasma is generated between the shower head 230 and the processing space 201 by adjusting impedance by the RF generator 252 and the matching box 251.

(Gas Supply System)

A common gas supply pipe 242 is connected to the gas introducing hole 241 provided on the lid 231 of the shower head 230. The common gas supply pipe 242 is communicated with the buffer space 232 in the shower head 230 by connecting to the gas introducing hole 241. Further, a first gas supply pipe 243a, a second gas supply pipe 244a, a third gas supply pipe 245a, and a connection pipe 249a are connected to the common gas supply pipe 242. The second gas supply pipe 244a is connected to the common gas supply pipe 242 through a remote plasma unit (RPU) 244e.

In these gas supply pipes, a source gas is mainly supplied from a source gas supply system 243 including the first gas supply pipe 243a, and mainly a reaction gas is supplied from a reaction gas supply system 244 including the second gas supply pipe 244a. Mainly an inert gas is supplied from a purge gas supply system 245 including the third gas supply pipe 245a when the wafer is processed, and mainly a cleaning gas is supplied from this purge gas supply system 245 when the shower head 230 and the processing space 201 are cleaned.

(Source Gas Supply System)

A source gas supply source 243b, a mass flow controller (MFC) 243c being a flow rate controller (flow rate control part), and a valve 243d being an open/close valve are provided on the first gas supply pipe 243a sequentially from the upstream direction. Then, the source gas is supplied into the shower head 230 from the first gas supply pipe 243a, through the MFC 243c, the valve 243d, and the common gas supply pipe 242.

The source gas is one of the processing gases, which is the source gas obtained by vaporizing $TiCl_4$ (Titanium Tetrachloride) being a metal liquid source containing Ti (titanium) for example (namely, the source gas is $TiCl_4$ gas). The source gas may be any one of a solid state, a liquid state, and a gas state at normal temperature and normal pressure. When the source gas is in the liquid state at normal temperature and normal pressure, a vaporizer not shown may be provided between the first gas supply source 243b and the mass flow controller 243c. Here, explanation is given for a case that the source gas in the gas state.

The source gas supply system 243 is formed by mainly the first gas supply pipe 243a, the MFC 243c, and the valve 243d. The source gas supply system 243 may also include the source gas supply source 243b and a first inert gas supply system described later. Further, the source gas supply system 243 is configured to supply a source gas which is one of the processing gases, and therefore corresponds to one of the processing gas supply systems.

A downstream end of the first inert gas supply pipe 246a is connected to downstream side of the valve 243d of the first gas supply pipe 243a. A mass flow controller (MFC) 246c being a flow rate controller (flow rate control part), and a vale 246d being an open/close valve are provided on the first inert gas supply pipe 246a sequentially from the upstream direction. Then, the inert gas is supplied from the first inert gas supply pipe 246a into the shower head 230 through the MFC 246c, the valve 246d, the first gas supply pipe 243a, and the common gas supply pipe 242.

The inert gas functions as a carrier gas of the source gas, and a gas not causing a reaction with a source is preferably used. Specifically, for example nitrogen ($N_2$) gas can be used. Further, rare gas such as helium (He) gas, neon (Ne) gas, and argon (Ar) gas, etc., can be used, other than the $N_2$ gas.

A first inert gas supply system is formed mainly by the first inert gas supply pipe 246a, the MFC 246c, and the valve 246d. The first inert gas supply system may also include an inert gas supply source 246b and a first gas supply pipe 243a. Further, the first inert gas supply system may also be included in the source gas supply system 243.

(Reaction Gas Supply System)

A reaction gas supply source 244b, a mass flow controller (MFC) 244c being a flow rate controller (flow rate control part), and a valve 244d being an open/close valve are provided on the second gas supply pipe 244a sequentially from the upstream direction. RPU 244e is provided on the downstream side of the valve 244d of the second gas supply pipe 244a. Then, the reaction gas is supplied into the shower head 230 through the MFC 244c, the valve 244d, the RPU 244e, and the common gas supply pipe 242. The reaction gas is set in plasma state by the remote plasma unit 244e and the surface of the waver 200 is irradiated with plasma.

The reaction gas is one of the processing gases, and for example ammonia ($NH_3$) gas is used.

A reaction gas supply system 244 is formed mainly by the second gas supply pipe 244a, the MFC 244c, and the valve 244d. The reaction gas supply system 244 may also include the reaction gas supply source 244b, the RPU 244e, and a second inert gas supply system described later. Further, the reaction gas being one of the processing gases is supplied by the reaction gas supply system 244, and therefore the reaction gas corresponds to other one of the processing gas supply systems.

The downstream side of the second inert gas supply pipe 247a is connected to the downstream end side of the valve 244d of the second gas supply pipe 244a. An inert gas supply source 247b, a mass flow controller (MFC) 247c being a flow rate controller (flow rate control part), and a valve 247d being an open/close valve are provided on the second inert gas supply pipe 247a sequentially from the upstream direction. Then, the inert gas is supplied into the shower head 230 from the second inert gas supply pipe 247a through the MFC 247C, the valve 247d, the second gas supply pipe 244a, the RPU 244e, and the common gas supply pipe 242.

The inert gas functions as a carrier gas of the reaction gas or a diluent gas. Specifically, for example, a nitrogen ($N_2$) gas can be used. Further, rare gas such as helium (He) gas, neon (Ne) gas, and argon (Ar) gas, etc., can be used, other than the $N_2$ gas.

A second inert gas supply system is formed mainly by the second inert gas supply pipe 247a, the MFC 247c, and the valve 247d. The second inert gas supply system may also include the inert gas supply source 247d, the second gas supply pipe 243a, and the RPU 244e. Further, the second inert gas supply system may also be included in the reaction gas supply system 244.

(Purge Gas Supply System)

A purge gas supply source 245b, a mass flow controller (MFC) 245C being a flow rate controller (flow rate control part), and a valve 245d being an open/close valve are provided on the third gas supply pipe 245a sequentially form the upstream direction. Then, in the substrate processing step, the inert gas as a purge gas is supplied from the third gas supply pipe 245a into the shower head 230 through the MFC 245c, the valve 245d, and the common gas supply pipe 242. Further, in the cleaning step, the inert gas as a carrier gas of the cleaning gas or a diluent gas is supplied into the shower head 230 as needed, through the MFC 245c, the valve 245d, and the common gas supply pipe 242.

In the substrate processing step, the inert gas supplied from the purge gas supply source 245b functions as a purge gas for purging the gas accumulated in the processing vessel 202 and the shower head 230. Further, in the cleaning step, the inert gas may also function as the carrier gas of the cleaning gas or the diluent gas. Specifically, for example nitrogen ($N_2$) gas can be used as the inert gas. Further, rare gas such as helium (He) gas, neon (Ne) gas, and argon (Ar) gas, etc., can be used, other than the $N_2$ gas.

A purge gas supply system 245 is formed mainly by the third gas supply pipe 245a, the MFC 245c, and the valve 245d. The purge gas supply system 245 may also include the purge gas supply source 245b and the cleaning gas supply system described later.

(Cleaning Gas Supply System)

The downstream side of the cleaning gas supply pipe 248a is connected to the downstream end side of the valve 245d of the third gas supply pipe 245a. A cleaning gas supply source 248b, a mass flow controller (MFC) 248c, and a valve 248d being an open/close valve are provided on the cleaning gas supply pipe 248a sequentially from the upstream direction. Then, the cleaning gas is supplied from the third gas supply pipe 245a into the shower head 230 through the MFC 248c, the valve 248d, and the common gas supply pipe 242.

The cleaning gas supply system is also connected to a second exhaust pipe 262 described later, through the common gas supply pipe 242 and the connection pipe 249a. In the cleaning step, the cleaning gas is supplied into the shower head 230 from a route passing through the common gas supply pipe 242, the connection pipe 249a, and the second exhaust pipe 262.

The cleaning gas supplied from the cleaning gas supply source 248b functions as the cleaning gas for removing byproducts, etc., adhered to the shower head 230 and the processing vessel 202 in the cleaning step. Specifically, for example nitrogen trifluoride ($NF_3$) gas can be used as the cleaning gas. Further for example, hydrogen fluoride (HF) gas, chlorine trifluoride ($ClF_3$) gas, and fluorine ($F_2$) gas may be used, and a combination of them may be used.

A cleaning gas supply system is formed mainly by the cleaning gas supply pipe 248a, the MFC 248c, and the valve 248d. The cleaning gas supply system may also include the cleaning gas supply source 248b and the third gas supply pipe 245a. Further, the cleaning gas supply system may also be included in the purge gas supply system 245.

(Gas Exhaust System)

An exhaust system for exhausting an atmosphere of the processing vessel 202 has a plurality of exhaust pipes connected to the processing vessel 202. Specifically, the exhaust system includes an exhaust pipe (first exhaust pipe) 261 connected to the transport space 203, an exhaust pipe (second exhaust pipe) 262 connected to the buffer space 232, and an exhaust pipe (third exhaust pipe) 263 connected to the processing space 201. Further, an exhaust pipe (fourth exhaust pipe) 264 is connected to the downstream side of each of the exhaust pipes 261, 262, and 263.

(First Gas Exhaust System)

The first exhaust pipe 261 is connected to a side face or a bottom face of the transport space 203. A turbo molecular pump 265 (TMP) is provided on the first exhaust pipe 261 as a vacuum pump for realizing a high vacuum state or an ultra-high vacuum state. A valve 266 is provided on the downstream side of the TMP 265 on the first exhaust pipe 261. Further, a valve 267 is provided on the upstream side of the TMP 265 on the first exhaust pipe 261. Further, a bypass pipe 261a is connected to the upstream side of the valve 267 on the first exhaust pipe 261. A valve 261b is provided on the bypass pipe 261a. The downstream side of the bypass pipe 261a is connected to the fourth exhaust pipe 264.

A first gas exhaust system is formed mainly by the first exhaust pipe 261, TMP 265, valves 266, 267, the bypass pipe 261a, and the valve 261b.

(Second Gas Exhaust System)

The second exhaust pipe 262 is connected to an upper surface of the buffer space 232 (specifically an upper position of the gas guide 235). Namely, the second exhaust pipe 262 is connected to the shower head 230, thus communicating with the buffer space 232 in the shower head 230. Further, a valve 268 is provided on the second exhaust pipe 262. The valve 268 is configured to open/close a gas flow path of the second exhaust pipe 262. The valve 268 may correspond to an opening degree adjustment function of opening and closing the gas flow path.

A second gas exhaust system is formed mainly by the second exhaust pipe 262 and the valve 268.

(Third Gas Exhaust System)

The third exhaust pipe 263 is connected to a side part of the processing space 201. An auto pressure controller (APC) 269 being a pressure controller for controlling a pressure in the processing space 201 to a specific pressure, is provided on the third exhaust pipe 263. The APC 269 has a valve body (not shown) capable of adjusting the opening degree, and adjusts a conductance of the third exhaust pipe 263 under an instruction from a controller described later. A valve 271 is provided on the upstream side of the APC 269 on the third exhaust pipe 263.

A third gas exhaust system is formed mainly by the third exhaust pipe 263, the APC 269, and the valve 271.

A dry pump (DP) 272 is provided on the fourth exhaust pipe 264. As shown in the figure, the second exhaust pipe 262, the third exhaust pipe 263, the first exhaust pipe 261, and the bypass pipe 261a are connected to the fourth exhaust pipe 264 from its upstream side, and DP 272 is provided on the downstream of them. DP 272 exhausts each atmosphere of the buffer space 232, the processing space 201, and the transport space 203 through each of the second exhaust pipe 262, the third exhaust pipe 263, the first exhaust pipe 261, and the bypass pipe 261a. DP 272 also functions as an auxiliary pump when TMP 265 is operated.

(Connection Pipe (Branch Pipe))

A connection pipe 249a is connected to the common gas supply pipe 242 in the gas supply system. The common gas supply pipe 242 and the second exhaust pipe 262 are connected to the connection pipe 249a.

The connection pipe 249a is connected to the common gas supply pipe 242 on more downstream side in the gas supplying direction, than the connection part connecting to the common gas supply pipe 242 of the cleaning gas supply system (specifically, on the third gas supply pipe 245a to which the cleaning gas is supplied in the cleaning step). The connection pipe 249a can also be regarded as a branch pipe branched from the common gas supply pipe 242.

One end side of the connection pipe 249a with the other end side connected to the common gas supply pipe 242, is connected to the second exhaust pipe 262 in the second gas exhaust system. However, the connection pipe 249a is connected to the second exhaust pipe 262 on more upstream side in gas exhausting direction, than the valve 268 provided on the second exhaust pipe 262. Namely, the valve 268 in the second gas exhaust system is configured to open/close the gas flow path on more downstream in gas exhausting direction, than the connection part connecting to the second exhaust pipe 262 of the connection pipe 249a.

Thus, the connection pipe 249a is configured to communicate the common gas supply pipe 242 (particularly the downstream side of the cleaning gas supply system in the gas supplying direction) and the second exhaust pipe 262 (particularly on the upstream side of the valve 268 in the gas exhausting direction), without passing through the buffer space 232 in the shower head 230.

Further, the valve 249b is provided on the connection pipe 249a. The valve 249b is configured to open and close the gas flow path of the connection pipe 249a. The valve 249b may correspond to the opening degree adjustment function of opening and closing the gas flow path.

A cleaning gas auxiliary supply system 249 is formed mainly by the connection pipe 249a and the valve 249b. The cleaning gas auxiliary supply system having such a structure is configured to assist supply of the cleaning gas into the shower head 230, which is performed by the cleaning gas supply system as needed.

(Controller)

The substrate processing apparatus 100 has a controller 280 for controlling an operation of each part of the substrate processing apparatus 100. The controller 280 has at least a calculation part 281 and a memory part 282. The controller 280 is connected to abovementioned each structure, retrieves a program and a recipe from the memory part 282 as needed under instruction of a host computer or a user, and controls the operation of each structure according to a content of the program or the recipe. Specifically, the controller 280 controls operations of the gate valve 205, the elevation mechanism 218, the heater 213, the RF power generator 252, the matching box 251, MFCs 243c to 248c, valves 243d to 248d, APC 269, TMP 265, DP 272, and valves 266, 267, 268, 271, and 261b, etc.

The controller 280 may also be configured as a dedicated computer or may be configured as a general purpose computer. For example, an external memory device storing the abovementioned program (for example, magnetic tape, a magnetic disc such as a flexible disc and a hard disc, etc., an optical disc such as MO, and a semiconductor memory such as a USB memory and a memory card, etc.) 283 is prepared, and the program is installed on the general purpose computer using the external memory device 283, to thereby constitute the controller 280 of this embodiment.

Further, means for supplying the program to the computer is not limited to a supply through the external memory device 283. For example, the program may be supplied to the computer not through the external memory device 283, using a communication means such as Internet or dedicate lines, etc., for example. The memory part 282 and the external memory device 283 are configured as a non-transitory computer-readable recording medium. They are generally simply called a recording medium hereafter. In this specification, when using the term of recording medium, this is a case including the memory part 282 alone, a case including the external memory device 283 alone, or a case including both of them.

(2) Substrate Processing Step

The step of forming a thin film on the wafer 200 using the substrate processing apparatus 100 will be described next, as one step of the method for manufacturing a semiconductor device. In the explanation hereafter, the operation of each part constituting the substrate processing apparatus 100 is controlled by the controller 280.

Here, explanation is given for an example of forming a TiN film as a metal thin film on the wafer 200 using $TiCl_4$ gas obtained by vaporizing $TiCl_4$ as a source gas (first processing gas), and using $NH_3$ gas as a reaction gas (second processing gas), and alternately supplying these gases.

Figure 2:
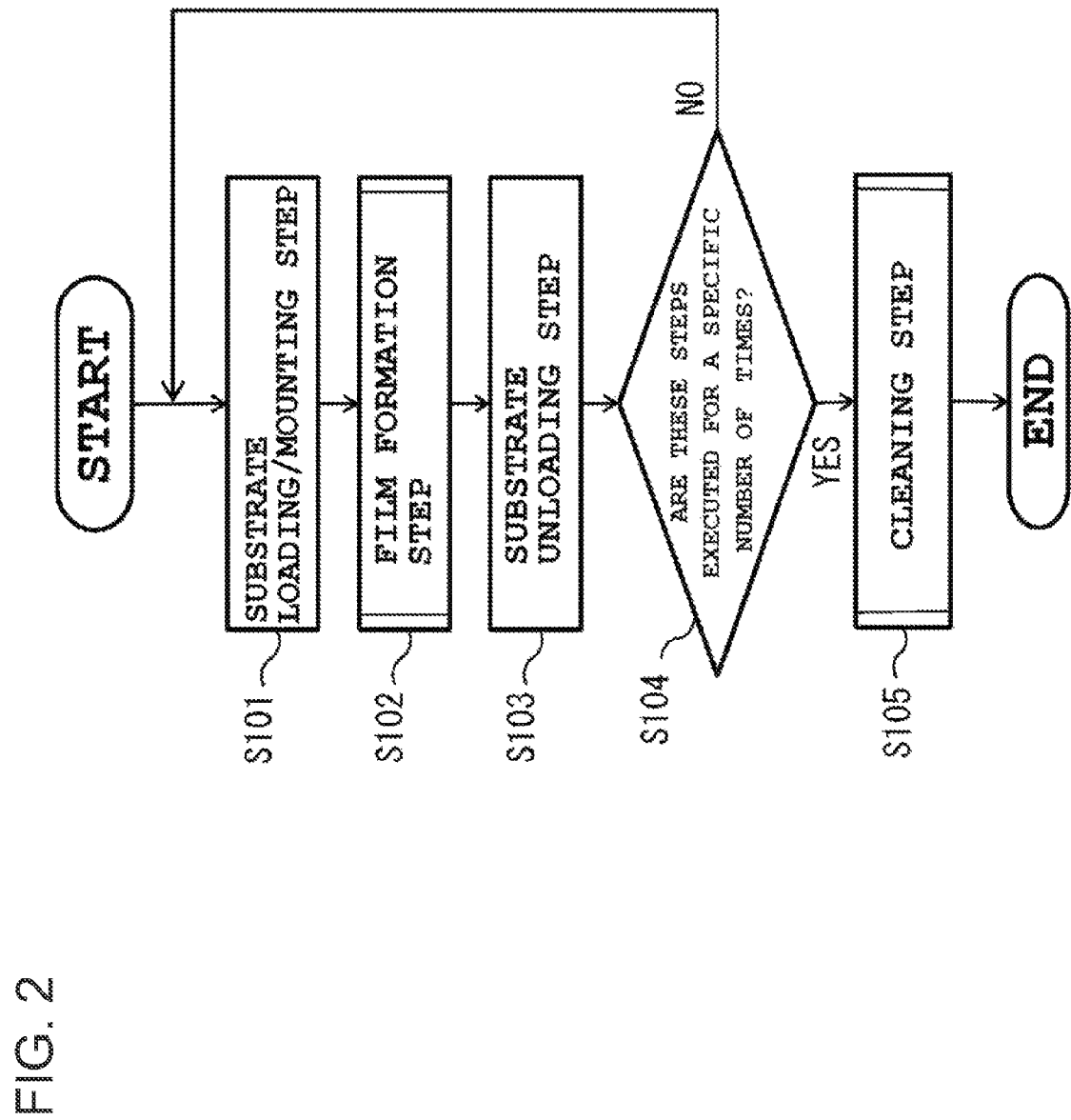
FIG. 2 is a flowchart showing a substrate processing step according to an embodiment of the present invention.
Figure 3:
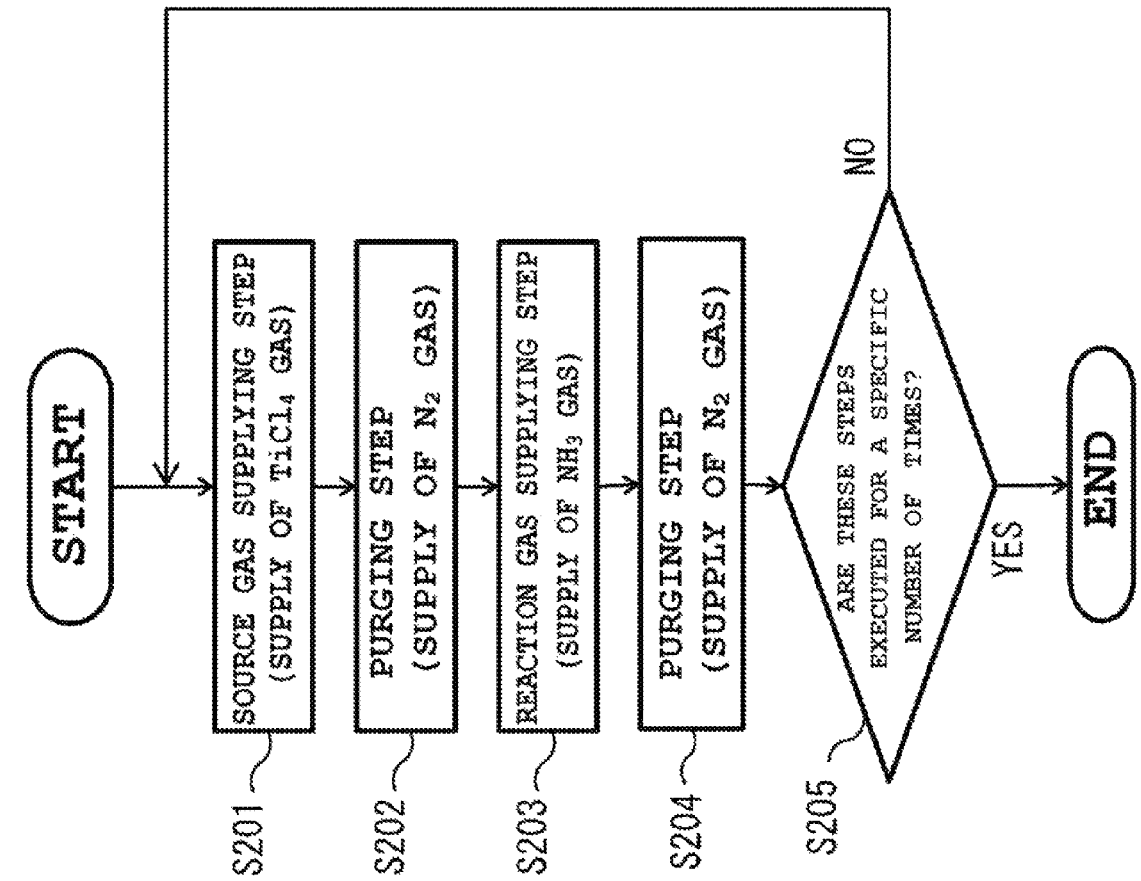
FIG. 3 is a flowchart showing a detail of a film formation step of FIG. 2.

FIG. 2 is a flowchart showing the substrate processing step according to this embodiment. FIG. 3 is a flowchart showing details of the film formation step of FIG. 2.

(Substrate Loading/Mounting Step: S101)

In the substrate processing apparatus 100, first, the lift pin 207 is passed through the through hole 214 of the substrate mounting table 212 by descending the substrate mounting table 212 to a transport position of the wafer 200. As a result, the lift pin 207 is set in a state of protruding from the surface of the substrate mounting table 212 by a specific height portion. Subsequently, the gate valve 205 is opened, to thereby communicate the transport space 203 with a transfer chamber (not shown). Then, the wafer 200 is loaded into the transport space 203 from the transfer chamber using a wafer transfer machine (not shown), to thereby transfer the wafer 200 on the lift pin 207. Thus, the wafer 200 is supported in a horizontal posture on the lift pin 207 protruded from the surface of the substrate mounting table 212.

When the wafer 200 is loaded into the processing vessel 202, the wafer transfer machine is retreated to outside of the processing vessel 202, and the gate valve 205 is closed to thereby air-tightly close the inside of the processing vessel 202. Thereafter, the wafer 200 is mounted on the substrate mounting surface 211 provided on the substrate mounting table 212 by elevating the substrate mounting table 212, and the substrate mounting table 212 is further elevated, to thereby elevate the wafer 200 up to a processing position in the abovementioned processing space 201.

When the wafer 200 is loaded into the processing vessel 202, the valve 266 and the valve 267 are set in an open state (the valve is opened), to thereby make a communication between the transport space 203 and the TMP 265, and also make a communication between the TMP 265 and the DP 272. Meanwhile, the valve of the exhaust system excluding the valve 266 and the valve 267 is set in a close state (the valve is closed). Thus, the atmosphere of the transport space 203 is exhausted by the TMP 265 (and the DP 272).

After the wafer 200 is loaded into the transport space 203 and is elevated up to the processing position in the processing space 201, the valve 266 and the valve 267 are set in a close state. Thus, the communication between the transport space 203 and the TMP 265, and the communication between the TMP 265 and the exhaust pipe 264 are blocked, to thereby end exhaust of the transport space 203 by the TMP 265. Meanwhile, the valve 271 is opened, to thereby make a communication between the processing space 201 and the APC 269. APC 269 controls an exhaust flow rate of the processing space 201 by DP 272 by adjusting the conductance of the exhaust pipe 263, and maintains the pressure in the processing space 201 in a specific pressure. The valve of other exhaust system is maintained in the close state.

In this step, $N_2$ gas may be supplied into the processing vessel 202 from the inert gas supply system as an inert gas, while exhausting the inside of the processing vessel 202. Namely, $N_2$ gas may be supplied into the processing vessel 202 by opening at least the valve 245d of the third gas supply system while exhausting the inside of the processing vessel 202 by TMP 265 or DP 272. Thus, particles can be prevented from adhering to the wafer 200.

Further, when the wafer 200 is mounted on the substrate mounting table 212, power is supplied to the heater 213 which is embedded in the substrate mounting table 212, and a temperature of the surface of the wafer 200 is controlled to a specific processing temperature. At this time, the temperature of the heater 213 is adjusted by controlling a power supply condition to the heater 213 based on temperature information detected by a temperature sensor not shown.

Thus, in the substrate loading/mounting step (S101), the pressure in the processing space 201 is controlled in a specific processing pressure, and a surface temperature of the wafer 200 is controlled in a specific processing temperature. Here, the specific processing temperature and the specific processing pressure mean the processing temperature and the processing pressure capable of forming the TiN film, and mean for example the processing temperature and the processing pressure not allowing a self-decomposition to occur in the source gas supplied in the source gas supplying step (S201). Specifically, it can be considered that the processing temperature is a room temperature or more and 500° C. or less, preferably a room temperature or more and 400° C. or less, and the processing pressure is 50 to 5000 Pa. The processing temperature and the processing pressure are also maintained in the film formation step (S102) described later.

(Film Formation Step: S102)

After the substrate loading/mounting step (S101), the film formation step (S102) is performed. The film formation step (S102) will be described hereafter in detail, with reference to FIG. 3. The film formation step (S102) is a cyclic process of repeating the step of alternately supplying different processing gases.

(Source Gas Supplying Step: S201)

In the film formation step (S102), first, a source gas supplying step (S201) is performed. In the source gas supplying step (S201), the source gas (namely $TiCl_4$ gas) is generated by vaporizing the source ($TiCl_4$) (preliminary vaporization). The preliminary vaporization of the source gas may be performed in parallel to the abovementioned substrate loading/mounting step (S101). This is because a specific time is required for stably generating the source gas.

Then, when the source gas is generated, the valve 243d is opened, and the mass flow controller 243c is adjusted so that a flow rate of the source gas reaches a specific flow rate, to thereby start supply of the source gas ($TiCl_4$ gas) into the processing space 201. A supply flow rate of the source gas is 100 to 3000 sccm for example. The source gas is dispersed by the shower head 230 and is uniformly supplied on the wafer 200 in the processing space 201.

At this time, the valve 246d of the first inert gas supply system is opened, to thereby supply the inert gas ($N_2$ gas) from the first inert gas supply pipe 246a. The supply flow rate of the inert gas is 500 to 5000 sccm for example. The inert gas may also be flowed from the third gas supply pipe 245a of the purge gas supply system.

An excessive source gas flows through the third exhaust pipe 263 of the third gas exhaust system and is exhausted to the fourth exhaust pipe 264. Specifically, the valve 271 is set in an open state, and is controlled by APC 269 so that the pressure in the processing space 201 reaches a specific pressure. All valves of the exhaust system other than the valve 271 are set in a close state.

The processing temperature and the processing pressure in the processing space 201 at this time are the processing temperature and the processing pressure so that the self-decomposition is not allowed to occur in the first source gas. Therefore, gas molecules of the source gas are adsorbed on the wafer 200.

After elapse of a specific time from start of the supply of the source gas, the valve 243d is closed, to thereby stop the supply of the source gas. The supply time of the source gas and the carrier gas is 0.1 to 20 seconds for example.

(Purging Step: S202)

After stop of the supply of the source gas, the inert gas ($N_2$ gas) is supplied from the third gas supply pipe 245a, to thereby purge the shower head 230 and the processing space 201. At this time as well, the valve 271 is set in the close state, and is controlled by APC 269 so that the pressure in the processing space 201 reaches a specific pressure. Meanwhile, all valves of the gas exhaust system other than the valve 271 are set in the close state. Thus, the source gas that cannot be adsorbed on the wafer 200 in the source gas supplying step (S201), is removed by DP 272 from the processing space 201 through the third exhaust pipe 263.

Subsequently, the inert gas ($N_2$ gas) is supplied from the third gas supply pipe 245a, to thereby purge the shower head 230. Regarding the valve of the gas exhaust system at this time, the valve 271 is set in the close state, and meanwhile the valve 268 is set in the open state. Valves of other gas exhaust systems are remained to be opened. Namely, when the shower head 230 is purged, the communication between the processing space 201 and APC 269 is blocked, and the communication between APC 269 and the fourth exhaust pipe 264 is blocked, to thereby stop pressure control by APC 269, and meanwhile the communication is made between the buffer space 232 and DP 272. Thus, the source gas remaining in the shower head 230 (buffer space 232) is exhausted by DP 272 from the shower head 230 through the second exhaust pipe 262.

When purge of the shower head 230 is ended, the valve 271 is set in the open state to thereby resume pressure control by APC 269, and the valve 268 is set in the close state to thereby block the communication between the shower head 230 and the exhaust pipe 264. Valves of other gas exhaust systems are remained to be closed. At this time as well, supply of the inert gas from the third gas supply pipe 245a is continued, and purge of the shower head 230 and the processing space 201 is continued.

Here, in the purging step (S202), purge through the exhaust pipe 263 is performed before/after purge through the second exhaust pipe 262. However, purge through the second exhaust pipe 262 only may be acceptable. Further, purge through the exhaust pipe 262 and purge through the third exhaust pipe 263 may be simultaneously performed.

The supply flow rate of the inert gas ($N_2$ gas) in the purging step (S202) is 1000 to 10000 sccm for example. Further, the supply time of the inert gas is 0.1 to 10 seconds for example.

(Reaction Gas Supplying Step: S203)

When purge of the shower head 230 and the processing space 201 is completed, subsequently, a reaction gas supplying step (S203) is performed. In the reaction gas supplying step (S203), the valve 244d is opened, to thereby start supply of the reaction gas ($NH_3$ gas) into the processing space 201 through the remote plasma unit 244e and the shower head 230. At this time, the mass flow controller 244c is adjusted so that the flow rate of the reaction gas reaches a specific flow rate. The supply flow rate of the reaction gas is 1000 to 10000 sccm for example.

The reaction gas in plasma state is dispersed by the shower head 230 and uniformly supplied on the wafer 200 in the processing space 201, and reacted with the gas molecules of the source gas adsorbed on the wafer 200, to thereby generate a TiN film of about less than one atomic layer (less than 1 Å) on the wafer 200.

At this time, the valve 247d of the second inert gas supply system is opened, to thereby supply the inert gas ($N_2$ gas) from the second inert gas supply tube 247a. The supply flow rate of the inert gas is 500 to 5000 sccm for example. The inert gas may also be flowed from the third gas supply pipe 245a of the purge gas supply system.

The excessive gas and the reaction byproduct are flowed through the third exhaust pipe 263 of the third gas exhaust system, and exhausted to the fourth exhaust pipe 264. Specifically, the valve 271 is set in the open state, and the pressure in the processing space 201 is controlled to a specific pressure by APC 269. All valves of the exhaust system other than the valve 271 are closed.

After elapse of a specific time from start of the supply of the reaction gas, the valve 244d is closed, to thereby stop the supply of the reaction gas. The supply time of the reaction gas and the carrier gas is 0.1 to 20 seconds for example.

(Purging Step: S204)

After stop of supplying the reaction gas, a purging step (S204) is performed, to thereby remove the reaction gas and the reaction byproduct remaining in the shower head 230 and the processing space 201. The purging step (S204) may be performed similarly to the purging step (S202) described above, and therefore explanation is omitted here.

(Judging Step: S205)

The source gas supplying step (S201), the purging step (S203), the reaction gas supplying step (S203), and the purging step (S204) are set as one cycle, and the controller 280 judges whether or not this processing cycle is executed for a specific number of times (n-cycle) (S205). When the processing cycle is executed for a specific number of times, a titanium nitride (TiN) film having a desired film thickness is formed on the wafer 200.

(Substrate Unloading Step: S103)

After the film formation step (S102) including the above-mentioned each step (S201 to S205), as shown in FIG. 2, a substrate unloading step (S103) is performed next.

In the substrate unloading step (S103), the substrate mounting table 212 is descended, and the wafer 200 is supported on the lift pin 207 protruded from the surface of the substrate mounting table 212. Thus, the wafer 200 is set at the transport position from the processing position. Thereafter, the gate valve 205 is opened, to thereby unload the wafer 200 to outside of the processing vessel 202, using the wafer transfer machine. At this time, the valve 245d is closed, to thereby stop the supply of the inert gas into the processing vessel 202 from the third gas supply system.

In the substrate unloading step (S103), the valve 271 is set in the close state while moving the wafer 200 to the transport position from the processing position, to thereby stop the pressure control which is performed by APC 269. Meanwhile, the valve 261b is set in the open state so that communication is made between the transport space 203 and DP 272, to thereby exhaust the transport space 203 by DP 272. At this time, the valves of the other exhaust systems are set in the close state.

Subsequently, when the wafer 200 is moved to the transport position, the valve 261b is set in the close state, to thereby block the communication between the transport space 203 and the exhaust pipe 264. Meanwhile, the valve 266 and the valve 267 are set in the open state, to thereby exhaust the atmosphere of the transport space 203 by TMP 265 (and DP 272). In this state, the gate valve 205 is opened, to thereby unload the wafer 200 from the processing vessel 202 to the transfer chamber.

(Processing Number Judging Step: S104)

After unloading the wafer 200, the controller 280 judges whether or not the number of times of executing a series of each step of the substrate unloading/mounting step (S101), the film formation step (S102), and the substrate unloading step (S103) reaches a specific number of times (S104). When it is so judged that the number of times of executing each step reaches the specific number of times, processing is moved to a cleaning step (S105). When it is so judged that the number of times of executing each step does not reach the specific number of times, the processing is moved to the substrate loading/mounting step (S101), to start the processing of a succeedingly standby wafer 200.

(Cleaning Step: S105)

In the cleaning step (S105), the valve 248d of the cleaning gas supply system is opened, to thereby supply the cleaning gas to the processing space 201. At this time, application of power is carried out by the RF generator 252 and impedance matching is carried out by the matching box 251, to thereby plasma-excite the cleaning gas in the shower head and the processing space 201. The plasma-excited cleaning gas removes the byproduct adhered to walls of the shower head 230 and the processing space 201.

(3) Cleaning Step

Here, the cleaning step (S105) performed by the substrate processing apparatus 100 will be more specifically described, by giving specific examples.

Here, particularly, a cleaning gas flow at the time of performing the cleaning step (S105) will be described with reference to FIG. 1, by giving a first specific example, a second specific example, and a third specific example.

First Specific Example

In performing the cleaning step (S105), the controller 280 opens the valve 248d of the cleaning gas supply system, to thereby supply the cleaning gas into the common gas supply pipe 242 from the cleaning gas supply source 248b through the third gas supply pipe 245a. Then, the cleaning gas passes through the common gas supply pipe 242 and is sent to the buffer space 232 in the shower head 230.

Further, simultaneously the controller 280 opens the valve 249b of the cleaning gas auxiliary supply system 249, and makes the valve 268 of the second gas exhaust system remained in the close state. Then, the cleaning gas supplied into the common gas supply pipe 242 from the cleaning gas supply source 248b is branched and flowed into the connection pipe 249a from the connection part between the common gas supply pipe 242 and the connection pipe 249a, and passes through the connection pipe 249a, and thereafter further passes through the second exhaust pipe 262 of the second gas exhaust system, and is sent to the buffer space 232 in the shower head 230.

Namely, in the first specific example of the cleaning step (S105), the cleaning gas is supplied into the shower head 230, from both of the common gas supply pipe 242 connected to the shower head 230 for supplying a gas into the shower head 230, and the second exhaust pipe 262 connected to the shower head 230 for exhausting the gas from the shower head 230 (in other word, using the common gas supply pipe 242 and the second exhaust pipe 262 simultaneously).

Exhaust of the cleaning gas is performed through APC 269, with the valve 271 in the third gas exhaust system set in the open state.

According to the first specific example described above, in the shower head 230, the cleaning gas is positively supplied to not only the vicinity of the part where the common gas supply pipe 242 is connected, but also the vicinity of the part where the second exhaust pipe 262 is connected.

The second exhaust pipe 262 is an exhaust passage of the processing gas in the purging steps S202 and S204, and therefore there is a high possibility that an unnecessary film (reaction byproduct, etc.) is adhered to the vicinity of the part where the second exhaust pipe 262 is connected in the shower head 230. Meanwhile, the gas guide 234 is interposed between the second exhaust pipe 262 and the common gas supply pipe 242, and therefore the cleaning gas supplied from the common gas supply pipe 242 hardly goes around the vicinity of the part where the second exhaust pipe 262 is connected.

However, as described above, if the cleaning gas is supplied using not only the common gas supply pipe 242 but also the connection pipe 249a and the second exhaust pipe 262, cleaning efficiency can be improved at a desired part in the shower head 230, at a part where particularly the cleaning gas hardly goes around and cleaning is hardly performed (space above the gas guide 235), and further at a part where cleaning is hardly performed (in the vicinity of the connection part where the second exhaust pipe 262 is connected). In addition, since the second exhaust pipe 262 is used, there is no necessity for providing a dedicated cleaning gas supply passage separately, and complication of a gas route connected to the shower head 230 can be prevented as much as possible.

Figure 4:
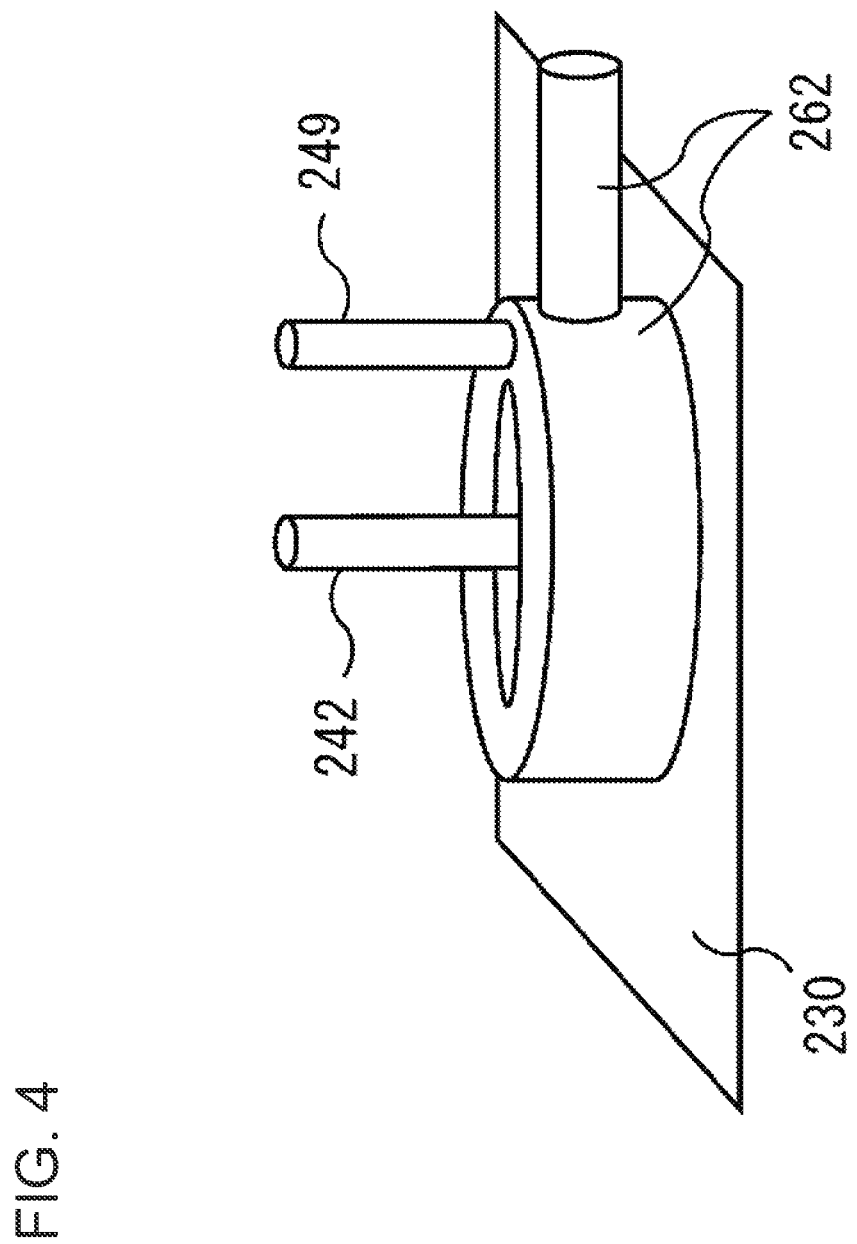
FIG. 4 is a view showing a modified example of a second exhaust pipe of FIG. 1.
Figure 5:
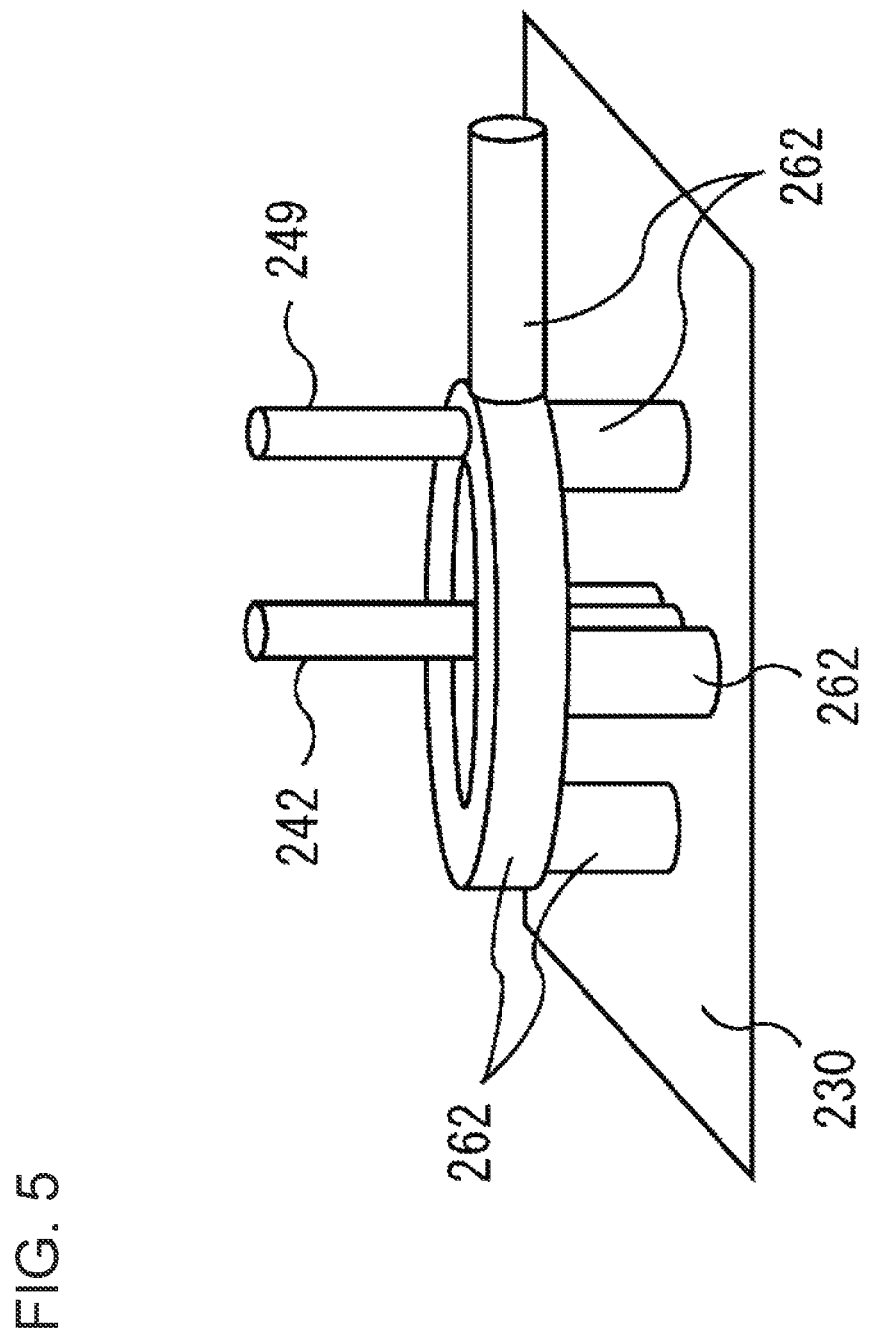
FIG. 5 is a view showing other modified example of the second exhaust pipe of FIG. 1.

When the cleaning gas is supplied into the shower head 230 using the second exhaust pipe 262, the connection part connecting to the shower head 230 of the second exhaust pipe 262 is formed into a ring shape surrounding an outer circumference of the common gas supply pipe 242 as shown in FIG. 4, or the connection part to the shower head 230 of the second exhaust pipe 262 may be formed by a plurality of pipelines arranged around the common gas supply pipe 242 as shown in FIG. 5. With this structure, the cleaning gas can be more uniformly supplied into the shower head 230, thus improving the cleaning efficiency. Further, since the cleaning gas is dispersed and supplied, overetching of the place that should be cleaned can also be prevented.

Second Specific Example

In the second specific example of the cleaning step (S105), a first cleaning processing of supplying the cleaning gas into the shower head 230 from the common gas supply pipe 242, and a second cleaning processing of supplying the cleaning gas into the shower head 230 from both of the common gas supply pipe 242 and the second exhaust pipe 262, are selectively (non-simultaneously) performed.

In performing the first cleaning processing, the controller 280 opens the valve 248d of the cleaning gas supply system, and supplies the cleaning gas into the common gas supply pipe 242 from the cleaning gas supply source 248b through the third gas supply pipe 245a. However, the valve 249b of the cleaning gas auxiliary supply system 249 and the valve 268 in the second gas exhaust system are remained in the close state. Then, the cleaning gas passes through the common gas supply pipe 242, and is sent to the buffer space in the shower head 230 from the common gas supply pipe 242 only.

Thus, in the first cleaning processing, cleaning is performed mainly to the processing space 201 from a main stream only, using the common gas supply pipe 242.

Meanwhile, in the second cleaning processing, similarly to the abovementioned first specific example, the controller 280 controls to supply the cleaning gas to the buffer space 232 in the shower head 230 using not only the common gas supply pipe 242 but also the connection pipe 249a and the second exhaust pipe 262.

Thus, in the second cleaning processing, cleaning is positively performed to an upper space (which is difficult to be cleaned (space above the gas guide 235) in addition to the processing space 201, using the common gas supply pipe 242, the connection pipe 249a, and the second exhaust pipe 262.

In each case of the first cleaning processing and the second cleaning processing, the cleaning gas is exhausted through the APC 269, with the valve 271 set in the open state in the third gas exhaust system.

The first cleaning processing and the second cleaning processing can be selected (switched) as follows.

Figure 6:
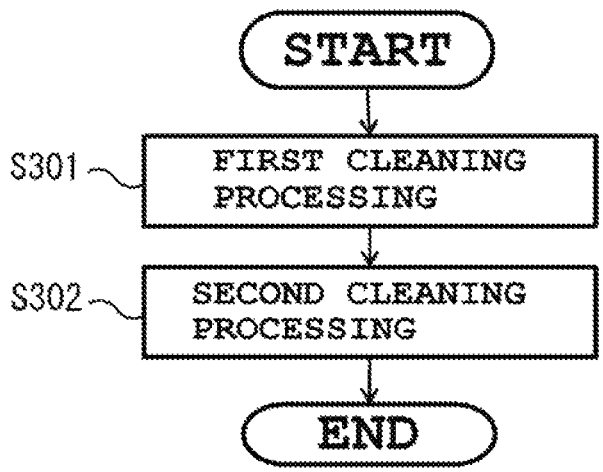
FIG. 6a and FIG. 6b are each a flowchart showing a detail of a specific example of a cleaning step of FIG. 2.
Figure 6:
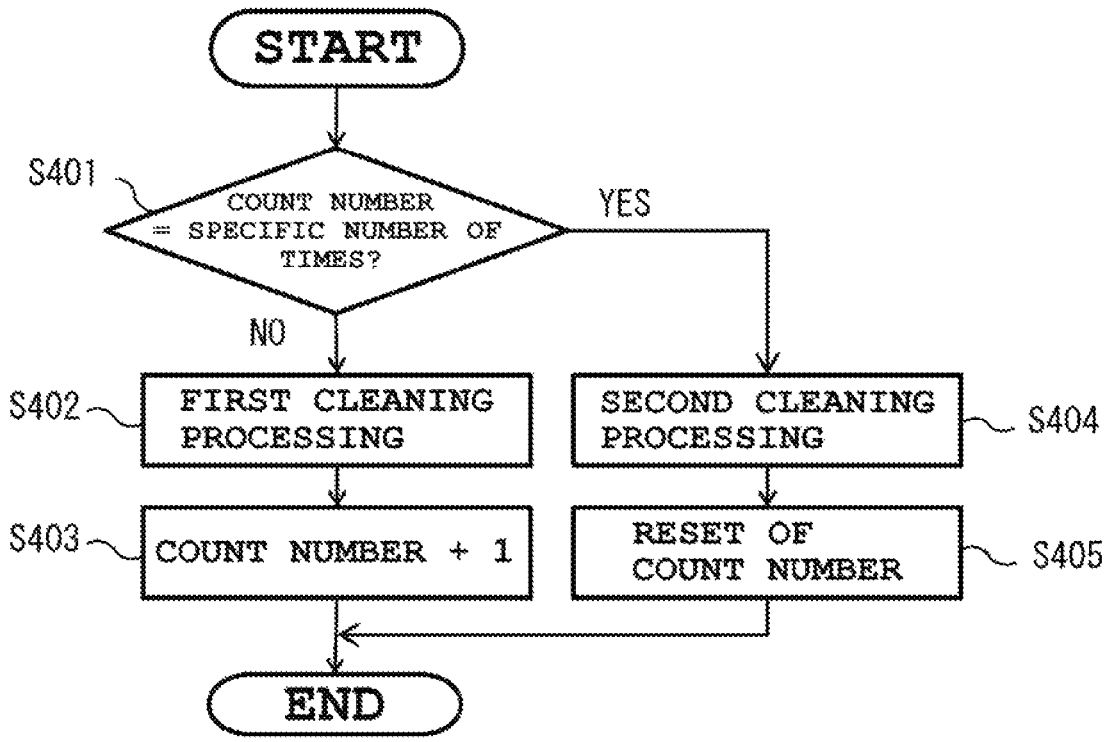

FIG. 6A and FIG. 6b are each a flowchart showing the detail of a specific example of the cleaning step.

For example, as shown in FIG. 6A, first, the controller 280 controls to perform the first cleaning processing (S301), and starts the second cleaning processing (S302) after the first cleaning processing is performed for a specific time. Each time may be suitably set in advance.

Thus, cleaning of the entire shower head 230 is started after executing the cleaning of a part (processing space 201) where film adhesion is severe, and therefore the time required for the entire process of the cleaning step (S105) can be shortened, and overetching of the place to be cleaned can be prevented.

Further, for example, the controller 280 may control to make a difference in frequency of executing the first cleaning processing and the second cleaning processing. More specifically, as shown in FIG. 6B, the controller 280 judges whether or not the execution count number of the first cleaning processing is a specific number of times (S401) in the cleaning step (S105), and controls to perform the first cleaning processing (S402) when the execution count number does not reach the specific number of times. Then, after the first cleaning processing is performed for a specific time, one execution count number is added to the execution count number of the first cleaning processing (S403). Further, when the execution count number of the first cleaning processing reaches the specific number of times, not the first cleaning processing but the second cleaning processing is performed (S404). Then, the execution count number of the first cleaning processing is reset (S405).

Thus, by making a difference in frequency of executing the first cleaning processing and the second cleaning processing, the second cleaning processing is not performed every time but performed only in a case when it is necessary, and therefore not only shortening the time required for the entire cleaning step (S105), but also reduction of the consumption of the cleaning gas, can be realized, and the overetching of the place to be cleaned can be prevented.

The abovementioned first cleaning processing and second cleaning processing can also be selected not by one of the techniques shown in FIG. 6A and shown in FIG. 6B fixingly, but by suitably switching. For example, when a temperature difference between the processing space 201 and the shower head 230 is relatively small in a low temperature processing such as ULT-SiO and the film adhesion is also easily generated in the shower head 230 similarly to the processing space 201, the second cleaning processing is performed every time as shown in FIG. 6A showing the first specific example or the second specific example, and meanwhile when a relatively large temperature difference can be provided in the processing space 201 and the shower head 230 by a relatively high temperature processing like film formation of TiN (when the film adhesion is more difficult in the shower head 230 than in the processing space 201), frequency is reduced in the second cleaning processing using the second exhaust pipe 262 connected to the shower head 230.

When the first cleaning processing and the second cleaning processing are selectively performed, the flow rate of the cleaning gas may be different in each of the processing. Namely, the controller 280 may control to make the flow rate different in the cleaning gas supplied from the cleaning gas supply system, between the first cleaning processing and the second cleaning processing. More specifically, when the second cleaning processing is performed using the second exhaust pipe 262 connected to the shower head 230, it can be considered that the flow rate of the cleaning gas is made large, compared with a case of performing the first cleaning processing.

Thus, even in a caser of selectively performing the first cleaning processing and the second cleaning processing, the consumption of the cleaning gas can be reduced, thus making it possible to previously prevent an insufficient supply of the cleaning gas.

Third Specific Example

In a third specific example of the cleaning step (S105), the controller 280 controls to open the valve 268 in the second gas exhaust system by a specific opening degree, when the second cleaning processing is performed. Then, apart of the cleaning gas sent to the second exhaust pipe 262 through the connection pipe 249a, is supplied into the shower head 230, and meanwhile a remaining gas flows to the fourth exhaust pipe 264 from the second exhaust pipe 262, thus also cleaning the second gas exhaust system connected to the shower head 230.

At this time, the controller 280 adjusts each flow rate balance of the cleaning gas supplied into the shower head 230, and the cleaning gas flowed to the fourth exhaust pipe 264 from the second exhaust pipe 262, by adjusting the opening degree of the valve 268. Further, at this time, the controller 280 may improve the cleaning efficiency for the second gas exhaust system by setting the valve 271 in the third gas exhaust system in the close state.

Further, when the second gas exhaust system is cleaned by setting the valve 268 in the open state, the difference may be provided in the frequency of executing the cleaning, similarly to the abovementioned case of the second specific example. Specifically, as the frequency of executing the cleaning, the following case can be set: execution number of the first cleaning processing>second cleaning processing with the valve 268 closed (positive cleaning of the upper part of the shower head 230 using the second exhaust pipe 262)≥second cleaning processing with the valve 268 opened (simultaneous cleaning performed to the second gas exhaust system).

Explanation is given for a case that the controller 280 adjusts the opening degree of the valve 268. However, the controller 280 may also adjust the opening degree of the valve 249b in the cleaning gas auxiliary supply system 249, together with the adjustment of the opening degree of the valve 268. Thus, each flow rate balance can be adjusted for the cleaning gas supplied through a main stream using the common gas supply pipe 242, the cleaning gas supplied into the shower head 230 using the connection pipe 249a and the second exhaust pipe 262, and the cleaning gas flowed to the fourth exhaust pipe 264 from the second exhaust pipe 262.

This can also be said for not only the case of the third specific example but also the case of the first specific example and the second specific example. Namely, each flow rate balance can be adjusted in the cleaning gas supplied through the main stream using the common gas supply pipe 242 and the cleaning gas supplied into the shower head 230 using the connection pipe 249a and the second exhaust pipe 262, by adjusting the opening degree of the valve 249b by the controller 280.

(4) Effect of the Embodiment

According to this embodiment, one or a plurality of effects are exhibited as follows.

(a) According to this embodiment, the substrate processing apparatus 100 is configured to have the cleaning gas auxiliary supply system 249 using the connection pipe 249a and the valve 249b, with the connection pipe 249a communicated with the common gas supply pipe 242 (particularly on the downstream side of the cleaning gas supply system in the gas supplying direction) and the second exhaust pipe 262 (particularly on the upstream side of the valve 268 in the gas exhausting direction), without passing through the buffer space 232 in the shower head 230. Then, the valve 249b for opening and closing the gas flow path of the connection pipe 249a, is provided on the connection pipe 249a. Therefore, in the cleaning step (S105) which is one of the manufacturing steps of the semiconductor device, the substrate processing apparatus 100 can supply the cleaning gas into the shower head 230 from both of the common gas supply pipe 242 connected to the shower head 230 for supplying gas into the shower head 230, and the second exhaust pipe 262 connected to the shower head 230 for exhausting the gas from the shower head 230. Namely, in the shower head 230, the cleaning gas is positively supplied to not only the part where the common gas supply pipe 242 is connected, but also the vicinity of the part where the second exhaust pipe 262 is connected.

Therefore, according to this embodiment, the cleaning gas can be supplied into the shower head 230 using not only the common gas supply pipe 242, but also the connection pipe 249a and the second exhaust pipe 262, and therefore the cleaning can efficiently reach a desired position in the shower head 230, particularly the place which is difficult to be cleaned, and further the place where the film adhesion easily occurs and the cleaning is difficult. As a result, cleaning efficiency can be improved. In addition, according to this embodiment, the second exhaust pipe 262 connected to the shower head 230 is used for exhausting the gas from the shower head 230, and therefore there is no necessity for connecting a dedicated cleaning gas supply passage to the shower head 230 separately, and complication of the gas route connected to the shower head 230 (namely an apparatus structure of the substrate processing apparatus 100) can be suppressed as much as possible. Namely, according to this embodiment, the cleaning efficiency can be effectively improved by supplying the cleaning gas to the desired place in the shower head 230 without leak, while suppressing the complication of the apparatus structure as much as possible.

(b) Further, according to this embodiment, when the cleaning gas is supplied into the shower head 230 using the second exhaust pipe 262, the shape of the connection part of the second exhaust pipe 262 is formed into a ring shape, or the connection part of the second exhaust pipe 262 is formed by a plurality of pipelines. With this structure, the cleaning gas can be more uniformly supplied into the shower head 230, thus further improving the cleaning efficiency, compared with a case of not having this structure.

(c) Further, according to this embodiment, in performing the cleaning step (S105), the controller 280 controls to switch which of the first cleaning processing and the second cleaning processing is selected, and therefore the cleaning processing required depending on a situation can be performed, and in this point as well, the cleaning efficiency can be improved.

(d) Further, according to the this embodiment, the frequency of executing the first cleaning processing and the second cleaning processing can be differentiated, and therefore the cleaning efficiency can be remarkably improved, and the consumption of the cleaning gas can be reduced, and further the overetching of the part to be cleaned can be suppressed.

(e) Further, according to this embodiment, when the frequency of executing the first cleaning processing and the second cleaning processing is differentiated, the second cleaning processing is performed after specific number of times of the first cleaning processing, and therefore the second cleaning processing is performed only when it is so required, and not is performed every time. Accordingly, the time required for the entire cleaning step (S105) can be shortened, and the consumption of the cleaning gas can be reduced, and also the overetching of the part to be cleaned can be suppressed.

(f) Further, according to this embodiment, when the first cleaning processing and the second cleaning processing is selectively performed, the second cleaning processing is started after the first cleaning processing is performed for a specific time, and therefore the time required for the entire cleaning step (S105) can be shortened, and the overetching of the part to be cleaned can be suppressed.

(g) Further, according to this embodiment, when the processing is switched to select which of the first cleaning processing and the second cleaning processing is performed, the flow rate of the cleaning gas supplied from the cleaning gas supply system is differentiated between the case of performing the first cleaning processing and the case of performing the second cleaning processing. Therefore the consumption of the cleaning gas can be reduced, and a situation of an insufficient cleaning gas can be prevented.

(h) Further, according to this embodiment, when the second cleaning processing is performed, the controller 280 controls to open the valve 268 (corresponding to the "first valve" of the present invention) in the second gas exhaust system by a specific opening degree. Therefore cleaning can be performed to the second gas exhaust system as well, which is connected to the shower head 230, together with the cleaning performed to the shower head 230.

(i) Further, according to this embodiment, when the second cleaning is performed, the controller 280 adjusts the opening degree of the valve 249b (corresponding to the "second valve" of the present invention) in the cleaning gas auxiliary supply system 249, and therefore the flow rate balance can be adjusted for the cleaning gas supplied through the main stream using the common gas supply pipe 242, and the cleaning gas supplied using the connection pipe 249a and the second exhaust pipe 262. Therefore, when compared with a case not having such a structure, the abovementioned structure of this embodiment is considerably effective for supplying the cleaning gas to a desired place in the shower head 230 without leak, and as a result, the cleaning efficiency can be further improved.

SECOND EMBODIMENT OF THE PRESENT INVENTION

A second embodiment of the present invention will be described next. Wherein, mainly a different point from the first embodiment will be described.

(Apparatus Structure)

Figure 7:
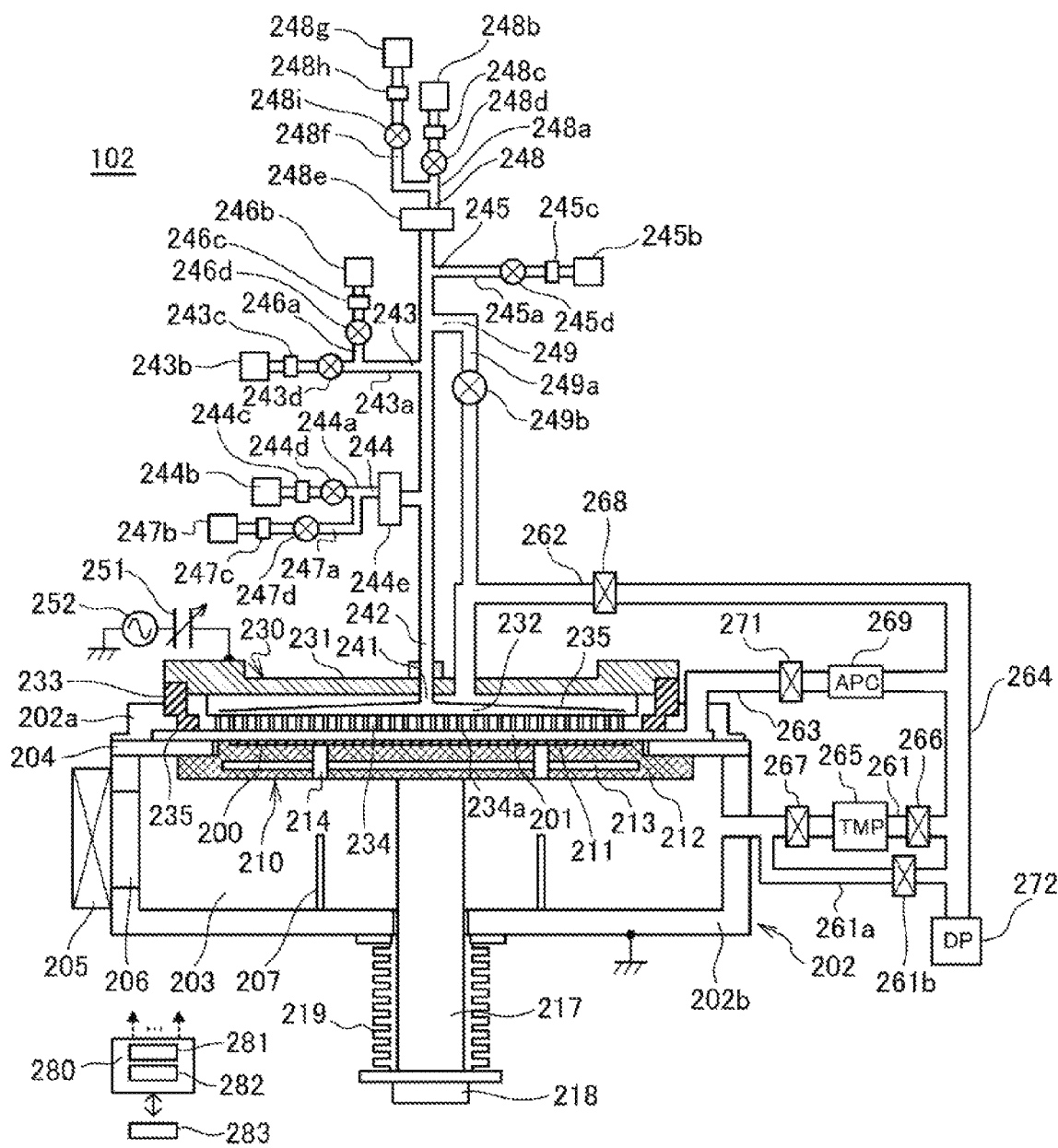
FIG. 7 is a schematic block diagram of a single wafer processing-type substrate processing apparatus according to a second embodiment of the present invention.

FIG. 7 is a schematic block diagram of a single wafer-processing type substrate processing apparatus according to a second embodiment. In the figure, the same signs and numerals are assigned to the same constituting features as those of the substrate processing apparatus 100 according to the first embodiment.

In a substrate processing apparatus 102 of the second embodiment, a gas supply system is different from the substrate processing apparatus 100 of the first embodiment. Specifically, the cleaning gas auxiliary supply system 249 including the source gas supply system 243, the reaction gas supply system 244, the purge gas supply system 245, and the connection pipe 249a, is connected to the common gas supply pipe 242, and this point is similar to the substrate processing apparatus 100 of the first embodiment. However, the cleaning gas supply system 248 is also connected to the common gas supply pipe 242, and in this point, the substrate processing apparatus 102 is different from the substrate processing apparatus 100 of the first embodiment. Therefore, the cleaning gas supply system is not included in the purge gas supply system 245.

(Cleaning Gas Supply System)

A downstream end of the cleaning gas supply pipe 248a is connected to the common gas supply pipe 242 through a remote plasma unit (RPU) 248e. A cleaning gas supply source 248b, a mass flow controller (MFC) 248c being a flow rate control unit (flow rate control part), and a valve 248d being an open/close valve, are provided on the cleaning gas supply pipe 248a sequentially from the upstream direction. Then, the cleaning gas supply pipe 248a is configured to supply the cleaning gas into the shower head 230 through the MFC 248c, the valve 248d, the RPU 248e, and the common gas supply pipe 242.

The cleaning gas supplied from the cleaning gas supply source 248b functions as the cleaning gas for removing the byproduct, etc., adhered to the shower head 230 and the processing vessel 202 in the cleaning step. Specifically, for example nitrogen trifluoride ($NF_3$) gas can be used as the cleaning gas. Further, for example hydrogen fluoride (HF) gas, chlorine trifluoride ($ClF_3$) gas, and fluorine ($F_2$) gas can also be used, or a combination of them can also be used. However, the cleaning gas that can be set in plasma state by RPU 248e can be used. In this embodiment, the cleaning gas is plasma-excited by RPU 248e, and therefore there is no necessity for using the matching box 251 and the RF generator 252 connected to the processing vessel 202 in the cleaning step. Instead, for example the matching box 251 and the RF generator 252 may be used in the reaction gas supplying step, and the reaction gas may be plasma-excited. Further, the matching box 251 and the RF generator 252 may not be provided.

The cleaning gas supply system. 248 is formed mainly by the cleaning gas supply pipe 248a, the MFC 248c, the valve 248d, and the RPU 248e. The cleaning gas supply system 248 may also include the cleaning gas supply source 248b and the third inert gas supply system described later.

The downstream end of the third inert gas supply pipe 248f is connected to the downstream side of the valve 248d of the cleaning gas supply pipe 248a. An inert gas supply source 248g, a mass flow controller (MFC) 248h being a flow rate control unit (flow rate control part), and a valve 248i being an open/close valve, are provided on the third inert gas supply pipe 248f sequentially from the upstream direction. Then, the inert gas is supplied into the shower head 230 from the third inert gas supply pipe 248f through the MFC 248h, the valve 248i, the cleaning gas supply pipe 248a, and the RPU 248e.

The inert gas functions as a carrier gas or a diluent gas of the cleaning gas. Specifically, nitrogen ($N_2$) gas can be used. Further, for example rare gas such as helium (He) gas, neon (Ne) gas, and argon (Ar) gas may be used in addition to the $N_2$ gas.

A third inert gas supply system is formed mainly by the third inert gas supply pipe 248f, the MFC 248h, and the valve 248i. The third inert gas supply system may also include the inert gas supply source 248g and the cleaning gas supply pipe 248g. Further, the third inert gas supply system may be included in the cleaning gas supply system 248. However, the third inert gas supply system is not necessarily required to be provided, and the purge gas supply system 245 can be used instead.

(Connection Pipe (Branch Pipe))

The connection pipe 249a connected to the common gas supply pipe 242 is connected to the common gas supply pipe 242 at least on more downstream side in the gas supplying direction than the RPU 248e of the cleaning gas supply system 248. The connection pipe 249a can be regarded as the branch pipe branched from the common gas supply pipe 242.

Further, the connection pipe 249a is connected to the common gas supply pipe 242 at least on more upstream side in the gas supplying direction than the connection part connecting to the common gas supply pipe 242 of the processing gas supply system. Both of the source gas supply system 243 and the reaction gas supply system 244 correspond to the processing gas supply system called here. Accordingly, the connection pipe 249a is connected to the common gas supply pipe 242 on more upstream side in the gas supplying direction than the connection part connecting to the common gas supply pipe 242 of the first gas supply pipe 243a in the source gas supply system 243, and on more upstream side in the gas supplying direction than the connection part connecting to the common gas supply pipe 242 of the second gas supply pipe 244a in the reaction gas supply system 244.

(Substrate Processing Step)

Subsequently, a substrate processing step performed by the substrate processing apparatus 102 of the second embodiment will be described.

In the substrate processing apparatus 102 as well, similarly to the abovementioned case of the first embodiment, the titanium nitride (TiN) film is formed on the wafer 200 by setting the source gas supplying step (S201), the purging step (S202), the reaction gas supplying step (S203), and the purging step (S204) as one cycle, and executing this processing cycle for a specific number of times (n-cycle) (see FIG. 3).

In the source gas supplying step (S201) of such a processing cycle, the source gas ($TiCl_4$ gas) is supplied to the common gas supply pipe 242 from the source gas supply system. 243 in the source gas supplying step (S201), and the reaction gas ($NH_3$ gas) is supplied to the common gas supply pipe 242 from the reaction gas supply system 244 in the reaction gas supplying step (S203). At this time, not only the source gas supply system 243 and the reaction gas supply system 244, etc., but also the connection pipe 249a constituting the cleaning gas auxiliary supply system 249, is connected to the common gas supply pipe 242. Therefore, the following situation can be considered: the source gas ($TiCl_4$ gas) or the reaction gas ($NH_3$ gas) is flowed into the connection pipe and a setting position, etc., of the valve 249b if the processing cycle is repeated, even in a case that the valve 249b is in the close state in the cleaning gas auxiliary supply system 249.

However, in the substrate processing apparatus 102 of the second embodiment, the connection pipe 249a is connected to the common gas supply pipe 242 on more upstream side in the gas supplying direction than the connection part connecting to the common gas supply pipe 242 of the source gas supply system 243 and the reaction gas supply system 244. Therefore, even if the processing cycle is repeated, the source gas (TiCl$_4$ gas) or the reaction gas (NH$_3$ gas) is not flowed into the connection pipe 249a and the setting position, etc., of the valve 249b, and an unnecessary film adhesion to the connection pipe 249a and the valve 249b, etc., can be suppressed.
(Cleaning Step)

Subsequently, the cleaning step performed by the substrate processing apparatus 102 of the second embodiment will be described.

In the substrate processing apparatus 102, the valve 248d of the cleaning gas supply system 248 is opened, to thereby supply the cleaning gas to the cleaning gas supply pipe 248a from the cleaning gas supply source 248b in the cleaning step (see S105 in FIG. 2). Then, the cleaning gas supplied to the cleaning gas supply pipe 248a is supplied to the common gas supply pipe 242 through the RPU 248e. At this time, the cleaning gas is plasma-excited by RPU 248e, and set in plasma state.

The cleaning gas in plasma state is supplied into the shower head 230 through the common gas supply pipe 242. At this time, the connection pipe 249a is connected to the common gas supply pipe 242 on more downstream side in the gas supplying direction than the RPU 248e. Accordingly, when the valve 249b in the cleaning gas auxiliary supply system 249 is in the open state (in a case of the first specific example or in a case of the second specific example or the second cleaning processing performed in the first specific example in the abovementioned first embodiment), the cleaning gas in plasma state is supplied into the shower head 230 through the connection pipe 249a and the second exhaust pipe 262.

Thus, in the substrate processing apparatus 102 of the second embodiment, the plasma-excited cleaning gas is supplied into the shower head 230. Therefore, the cleaning efficiency for the shower head 230 is improved, compared with a case of supplying non-plasma excited cleaning gas.

In addition, in the shower head 230, the plasma-excited cleaning gas is positively supplied to not only the vicinity of the part where the common gas supply pipe 242 is connected, but also the vicinity of the part where the second exhaust pipe 262 is connected. Therefore, the cleaning gas in plasma state can reach the vicinity of the part where the second exhaust pipe 262 is connected without being deactivated. Namely, the cleaning gas can reach the upper part in the shower head 230 (particularly in the vicinity of the connection part of the second exhaust pipe 262 where film adhesion easily occurs) before the cleaning gas is deactivated, by supplying the plasma-excited cleaning gas using not only the common gas supply pipe 242 but also the connection pipe 249a and the second exhaust pipe 262.
(Effect of the Embodiment)

According to this embodiment, following one or a plurality of effects are exhibited.

(j) According to this embodiment, the cleaning gas supply system 248 includes RPU 248e, and the cleaning gas is plasma-excited by this RPU 248e. Therefore, the cleaning efficiency for the shower head 230 is improved compared with a case of supplying the non-plasma-excited cleaning gas.

(k) Further, according to this embodiment, the connection pipe 249a is connected to the common gas supply pipe 242 on more downstream side in the gas supplying direction than the RPU 248e on the common gas supply pipe 242. Therefore, the plasma-excited cleaning gas can be supplied into the shower head 230 using the connection pipe 249a and the second exhaust pipe 262. Therefore, the cleaning gas can also reach the vicinity of the connection part of the second exhaust pipe 262 in the shower head 230 without deactivating the cleaning gas in plasma state. Namely, the cleaning gas in plasma state is supplied into the shower head 230 and in addition, the cleaning gas can reach a desired part in the shower head 230, particularly the part easy to cause film adhesion and difficult to be cleaned, before deactivating the cleaning gas in plasma state. Thus, the cleaning gas in plasma state can reach a desired position in the shower head 230 without being deactivated, by combining the plasma-excitation of the cleaning gas and supply of the cleaning gas into the shower head 230 using the connection pipe 249a and the second exhaust pipe 262. As a result, the cleaning efficiency can be extremely remarkably improved.

(l) Further, according to this embodiment, the connection pipe 249a is connected to the common gas supply pipe 242 on more upstream side in the gas supplying direction than the connection part connecting to the common gas supply pipe 242 of the source gas supply system 243 and the reaction gas supply system 244. Therefore, unnecessary film adhesion to the connection pipe 249a and the valve 249b, etc., can be suppressed, even if the processing cycle is repeated.

OTHER EMBODIMENT OF THE PRESENT INVENTION

As described above, the embodiment of the present invention has been specifically described. However, the present invention is not limited to the abovementioned each embodiment, and can be variously modified in a range not departing from the gist of the invention.

For example, the first embodiment shows an example of supplying the cleaning gas in non-plasma state into the shower head 230 from the cleaning gas supply source 248b, and meanwhile the second embodiment shows an example of supplying the cleaning gas into the shower head 230 from the cleaning gas supply source 248b after being set in plasma state by RPU 248e. However, the present invention is not limited thereto. Namely, in the case of the second embodiment as well, when the shower head 230 and the processing space 201 are filled with the cleaning gas, power may be applied by RF generator 252 and impedance may be matched by the matching box 251, so that plasma of the cleaning gas is generated in the shower head 230 and the processing space 201. Further, in the first embodiment, the cleaning gas is not necessarily plasma-excited.

For example, each of the abovementioned embodiments shows an example of the film formation processing as the processing performed by the substrate processing apparatuses 100 and 102. However, the present invention is not limited thereto. Namely, the processing may be the processing of forming an oxide film or a nitride film, or the processing of forming a film containing metal, other than the film formation processing. Further, a specific content of the substrate processing is not particularly limited, and the present invention can be suitably applied to not only the film formation processing but also other substrate processing such as annealing, oxidizing, nitriding, dispersing, and lithography, etc. The present invention can also be suitably applied to other substrate processing apparatus such as an annealing apparatus, an oxidizing apparatus, a nitriding apparatus, an exposure apparatus, a coater, a drier, a heater, and a processing apparatus utilizing plasma. Coexistence of these apparatuses is also acceptable. Further, a part of the structure of a certain embodiment can be replaced by the structure of other embodiment, and the structure of other embodiment can be added to the structure of the certain embodiment. Also, regarding a part of the structure of each embodiment, addition of other structure, deletion, and replacement can be acceptable.

PREFERRED ASPECT OF THE PRESENT INVENTION

Preferred aspect of the present invention will be supplementarily described hereafter.

[Supplementary Description 1]

According to a first aspect of the present invention, there is provided a substrate processing apparatus configured to process a substrate in a processing space by supplying a gas into the processing space through a shower head as a gas dispersion mechanism, including:

a gas supply pipe connected to the shower head;

a gas exhaust pipe connected to the shower head; and a cleaning gas supply system connected to the gas supply pipe and the gas exhaust pipe and configured to supply a cleaning gas into the shower head from both of the gas supply pipe and the gas exhaust pipe.

[Supplementary Description 2]

Preferably, there is provided the substrate processing apparatus according to supplementary description 1, including a connection pipe for connecting the gas supply pipe and the gas exhaust pipe, wherein the cleaning gas supply system is connected to the gas supply pipe on more upstream side in a gas supplying direction than the connection pipe on the gas supply pipe.

[Supplementary Description 3]

Preferably, there is provided the substrate processing apparatus according to supplementary description 2, including:

a first valve provided on more downstream side in a gas exhaust direction of the gas exhaust pipe than a connection part connecting to the gas exhaust pipe of the connection pipe and configured to open and close a gas flow path of the gas exhaust pipe; and a second valve provided on the connection pipe and configured to open and close the gas flow path of the connection pipe.

[Supplementary Description 4]

Preferably, there is provided the substrate processing apparatus according to supplementary description 2 or 3, including a plasma unit configured to plasma-excite a cleaning gas supplied into the gas supply pipe by the cleaning gas supply system, wherein the connection pipe is connected to the gas supply pipe on more downstream side in the gas supplying direction than the plasma unit on the gas supply pipe.

[Supplementary Description 5]

Preferably, there is provided the substrate processing apparatus according to any one of the supplementary descriptions 2 to 4, including a processing gas supply system connected to the gas supply pipe and configured to supply a processing gas into the gas supply pipe for processing the substrate, wherein the connection pipe is connected to the gas supply pipe on more upstream side in the gas supplying direction than a connection part connecting to the gas supply pipe of the processing gas supply system.

[Supplementary Description 6]

Preferably, there is provided the substrate processing apparatus according to any one of the supplementary descriptions 1 to 5, wherein the gas exhaust pipe is formed so that the connection part connecting to the shower head has a ring shape surrounding an outer periphery of the gas supply pipe.

[Supplementary Description 7]

Preferably, there is provided the substrate processing apparatus according to any one of the supplementary descriptions 1 to 5, wherein the gas exhaust pipe is constituted of a plurality of pipelines so that the connection part connecting to the shower head is arranged around the gas supply pipe.

[Supplementary Description 8]

Preferably, there is provided the substrate processing apparatus according to any one of the supplementary descriptions 3 to 7, including:

a controller configured to control an operation of supplying a cleaning gas into the gas supply pipe by the cleaning gas supply system, an operation of opening and closing a gas flow path of the gas exhaust pipe by the first valve, and an operation of opening and closing a gas flow path of the connection pipe by the second valve, wherein the controller closes the second valve to thereby perform a first cleaning processing of supplying a cleaning gas from the cleaning gas supply system into the shower head from the gas supply pipe, and closes the first valve and opens the second valve to thereby perform a second cleaning processing of supplying a cleaning gas from the cleaning gas supply system into the shower head, from both of the gas supply pipe and the gas exhaust pipe.

[Supplementary Description 9]

Preferably, there is provided the substrate processing apparatus according to supplementary description 8, wherein the controller differentiates a frequency of executing the first cleaning processing and the second cleaning processing.

[Supplementary Description 10]

Preferably, there is provided the substrate processing apparatus according to supplementary description 8 or 9, wherein the controller performs the second cleaning processing when the first cleaning processing is performed for a specific number of times.

[Supplementary Description 11]

Preferably, there is provided the substrate processing apparatus according to any one of supplementary descriptions 8 to 10, wherein the controller starts the second cleaning processing after the first cleaning processing is performed for a specific time.

[Supplementary Description 12]

Preferably, there is provided the substrate processing apparatus according to any one of supplementary descriptions 8 to 11, wherein the controller differentiates a flow rate of a cleaning gas supplied from the cleaning gas supply system, between a case of performing the first cleaning processing and a case of performing the second cleaning processing.

[Supplementary Description 13]

Preferably, there is provided the substrate processing apparatus according to any one of supplementary descriptions 8 to 12, wherein the controller adjusts an opening degree when the second valve is opened.

[Supplementary Description 14]

Preferably, there is provided the substrate processing apparatus according to any one of supplementary descriptions 8 to 13, wherein the controller opens the first valve by a specific opening degree, when the second cleaning processing is performed.

[Supplementary Description 15]

According to other aspect of the present invention, there is provided a method for manufacturing a semiconductor device, including:

processing a substrate in a processing space by supplying a gas into the processing space through a shower head as a gas dispersion mechanism; and supplying a cleaning gas into the shower head from both of a gas supply pipe connected to the shower head for supplying a gas into the shower head, and a gas exhaust pipe connected to the shower head for exhausting a gas from the shower head.

[Supplementary Description 16]

Preferably, there is provided the method for manufacturing a semiconductor device according to supplementary description 15, wherein the cleaning includes: selectively performing a first cleaning processing of supplying a cleaning gas into the shower head from the gas supply pipe, and a second cleaning processing of supplying a cleaning gas into the shower head from both of the gas supply pipe and the gas exhaust pipe.

[Supplementary Description 17]

According to other aspect of the present invention, there is provided a program for causing a computer to execute:

a substrate processing procedure of processing a substrate in a processing space by supplying a gas into the processing space through a shower head as a gas dispersion mechanism; and a cleaning procedure of supplying a cleaning gas into the shower head, from both of a gas supply pipe connected to the shower head for supplying a gas into the shower head, and a gas exhaust pipe connected to the shower head for exhausting a gas from the shower head.

[Supplementary Description 18]

Preferably, there is provided the program according to supplementary description 17, wherein the cleaning procedure includes: selectively performing a first cleaning procedure of supplying a cleaning gas into the shower head from the gas supply pipe; and a second cleaning procedure of supplying a cleaning gas into the shower head from both of the gas supply pipe and the gas exhaust pipe.

[Supplementary Description 19]

According to other aspect of the present invention, there is provided a non-transitory computer-readable recording medium, in which a program is stored for causing a computer to execute:

a substrate processing procedure of processing a substrate in a processing space by supplying a gas to the processing space through a shower head as a gas dispersion mechanism; and a cleaning procedure of supplying a cleaning gas into the shower head, from both of a gas supply pipe connected to the shower head for supplying a gas into the shower head, and a gas exhaust pipe connected to the shower head for exhausting a gas from the shower head.

[Supplementary Description 20]

Preferably, there is provided the non-transitory computer-readable recording medium in which the program of supplementary description 19 is stored, wherein the cleaning procedure includes: selectively performing a first cleaning processing of supplying a cleaning gas into the shower head from the gas supply pipe, and a second cleaning processing of supplying a cleaning gas into the shower head from both of the gas supply pipe and the gas exhaust pipe.

What is claimed is:

1. A substrate processing apparatus configured to process a substrate in a processing space by supplying a gas into the processing space through a shower head as a gas dispersion mechanism, comprising:
    a gas supply pipe connected to the shower head;
    a gas exhaust pipe connected to the shower head;
    a connection pipe for connecting the gas supply pipe and the gas exhaust pipe;
    a processing gas supply system connected to the gas supply pipe on a more downstream side in the gas supplying direction than a connection part connecting to the connection pipe and the gas supply pipe and configured to supply a processing gas into the gas supply pipe for processing the substrate;
    a cleaning gas supply system connected to the gas supply pipe and the gas exhaust configured to supply a cleaning gas into the shower head from both of the gas supply pipe and the gas exhaust pipe, and provided on a more upstream side in a gas supplying direction than a connection part connecting to the connection pipe and the gas supply pipe;
    a first valve provided on a more downstream side in a gas exhaust direction of the gas exhaust pipe than a connection part connecting to the gas exhaust pipe and the connection pipe and configured to open and close a gas flow path of the gas exhaust pipe; and
    a second valve provided on the connection pipe and configured to open and close a gas flow path of the connection pipe.

2. The substrate processing apparatus according to claim 1, wherein the cleaning gas supply system comprises a plasma unit configured to plasma excite the cleaning gas supplied into the gas supply pipe, and the connection pipe is connected to the gas supply pipe on more a downstream side in the gas supplying direction of the gas supply pipe than the plasma unit.

3. The substrate processing apparatus according to claim 1, wherein the gas exhaust pipe is formed so that a connection part connecting to the shower head has a ring shape surrounding an outer periphery of the gas supply pipe.

4. The substrate processing apparatus according to claim 1, wherein the gas exhaust pipe is configured so that a connection part connecting to the shower head is constituted of a plurality of pipelines so that the connection part connecting to the shower head is arranged around the gas supply pipe.

5. The substrate processing apparatus according to claim 1, comprising:
    a controller configured to control an operation of supplying the cleaning gas into the gas supply pipe by the cleaning gas supply system, an operation of opening and closing a gas flow path of the gas exhaust pipe by the first valve, and an operation of opening and closing a gas flow path of the connection pipe by the second valve,
    wherein the controller is configured to close the second valve to thereby perform a first cleaning processing of supplying the cleaning gas from the cleaning gas supply system into the shower head from the gas supply pipe, and close the first valve and open the second valve to thereby perform a second cleaning processing of supplying the cleaning gas from the cleaning gas supply system into the shower head, from both of the gas supply pipe and the gas exhaust pipe.

6. The substrate processing apparatus according to claim 5, wherein the controller is configured to differentiate a frequency of executing the first cleaning processing and the second cleaning processing.

7. The substrate processing apparatus according to claim 5, wherein the controller is configured to perform the second cleaning processing when the first cleaning processing is performed for a specific number of times.

8. The substrate processing apparatus according to claim 5, wherein the controller is configured to start the second cleaning processing after the first cleaning processing is performed for a specific time.

9. The substrate processing apparatus according to claim 5, wherein the controller is configured to differentiate a flow rate of the cleaning gas supplied from the cleaning gas supply system, between a case of performing the first cleaning processing and a case of performing the second cleaning processing.

10. The substrate processing apparatus according to claim 5, wherein the controller is configured to adjust an opening degree when the second valve is opened.

11. The substrate processing apparatus according to claim 5, wherein the controller is configured to open the first valve by a specific opening degree, when the second cleaning processing is performed.

12. The substrate processing apparatus according to claim 5, wherein the controller is configured to set a flow rate of the cleaning gas in a case of performing the second cleaning processing to be larger than a flow rate of the cleaning gas in a case of performing the first cleaning processing.

* * * * *